(12) United States Patent
Dickinson et al.

(10) Patent No.: US 6,846,380 B2
(45) Date of Patent: Jan. 25, 2005

(54) SUBSTRATE PROCESSING APPARATUS AND RELATED SYSTEMS AND METHODS

(75) Inventors: C. John Dickinson, San Jose, CA (US); Frank Jansen, San Jose, CA (US); Daimhin P. Murphy, San Francisco, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 57 days.

(21) Appl. No.: 10/170,578

(22) Filed: Jun. 13, 2002

(65) Prior Publication Data

US 2003/0232512 A1 Dec. 18, 2003

(51) Int. Cl.$^7$ .......................... C23F 1/00; C23C 16/00; B65G 49/07; H01L 21/306
(52) U.S. Cl. ...................... 156/345.31; 156/345.54; 118/719; 118/729; 204/298.25; 204/298.35; 414/935; 414/939
(58) Field of Search ................................. 118/719, 729; 156/345.31, 345.32, 345.54; 204/298.25, 298.23

(56) References Cited

U.S. PATENT DOCUMENTS

| | | | | |
|---|---|---|---|---|
| 4,439,261 A | * | 3/1984 | Pavone et al. ......... | 156/345.47 |
| 4,895,107 A | * | 1/1990 | Yano et al. .................. | 118/722 |
| 4,908,095 A | * | 3/1990 | Kagatsume et al. .......... | 216/67 |
| 4,944,837 A | | 7/1990 | Nishikawa et al. ......... | 156/646 |
| 5,158,704 A | | 10/1992 | Fulton et al. ................ | 252/309 |
| 5,266,205 A | | 11/1993 | Fulton et al. ................ | 210/639 |
| 5,306,350 A | | 4/1994 | Hoy et al. ................ | 134/22.14 |
| 5,377,705 A | | 1/1995 | Smith, Jr. et al. .......... | 134/95.3 |
| 5,482,564 A | | 1/1996 | Douglas et al. ................ | 134/18 |
| 5,494,526 A | | 2/1996 | Paranjpe .......................... | 134/1 |
| 5,496,901 A | | 3/1996 | DeSimone .................... | 526/89 |

(List continued on next page.)

FOREIGN PATENT DOCUMENTS

| | | |
|---|---|---|
| EP | 726099 A2 | 8/1996 |
| EP | 750334 A2 | 12/1996 |
| EP | 1106946 A2 | 6/2001 |
| WO | WO01/33613 A2 | 5/2001 |
| WO | WO01/60534 A1 | 8/2001 |
| WO | WO01/78911 A1 | 10/2001 |
| WO | WO01/82368 A2 | 11/2001 |
| WO | WO01/87505 A1 | 11/2001 |
| WO | WO02/15251 A1 | 2/2002 |

OTHER PUBLICATIONS

Brooks Automation Cluster Tool Integration Platforms (company brochure).

(List continued on next page.)

Primary Examiner—Parviz Hassanzadeh
Assistant Examiner—Karla Moore
(74) Attorney, Agent, or Firm—David A. Hey

(57) ABSTRACT

An apparatus and method for processing a microelectronic substrate comprises a main chamber and a movable boundary. The main chamber comprises a main chamber wall enclosing a main chamber interior. The movable boundary is disposed within the main chamber interior, and is movable between a first position and a second position. At the first position, the movable boundary at least partially defines a sub-chamber in which a substrate can be processed. The sub-chamber is fluidly isolated from the main chamber interior, and provides an environment suitable for a high-pressure processing of the substrate such as cleaning or surface preparation. The sub-chamber can be maintained at a high pressure while the main chamber is maintained at either a low pressure, an atmospheric pressure, or at a vacuum. The apparatus can be directly coupled to an external substrate handling and/or fabrication module, such that the main chamber interior provides a buffer between the sub-chamber and the external module. At the second position of the movable boundary, the substrate can be loaded into or removed from the apparatus, such as by transfer to or from any external module provided.

62 Claims, 15 Drawing Sheets

U.S. PATENT DOCUMENTS

| | | | |
|---|---|---|---|
| 5,514,220 A | | 5/1996 | Wetmore et al. .......... 134/22.18 |
| 5,520,743 A | * | 5/1996 | Takahashi ................... 118/730 |
| 5,522,938 A | | 6/1996 | O'Brien ......................... 134/1 |
| 5,589,105 A | | 12/1996 | DeSimone et al. ......... 252/351 |
| 5,639,836 A | | 6/1997 | DeSimone et al. ......... 526/201 |
| 5,665,527 A | | 9/1997 | Allen et al. ................. 430/325 |
| 5,679,737 A | | 10/1997 | DeSimone et al. ......... 524/529 |
| 5,688,879 A | | 11/1997 | DeSimone ................... 526/89 |
| 5,700,379 A | | 12/1997 | Biebl ............................ 216/2 |
| 5,739,223 A | | 4/1998 | DeSimone ................... 526/89 |
| 5,769,952 A | * | 6/1998 | Komino ...................... 118/733 |
| 5,780,553 A | | 7/1998 | DeSimone et al. ......... 525/276 |
| 5,783,082 A | | 7/1998 | DeSimone et al. ......... 210/634 |
| 5,860,467 A | | 1/1999 | DeSimone et al. ............ 164/5 |
| 5,866,005 A | | 2/1999 | DeSimone et al. ......... 210/634 |
| 5,868,856 A | | 2/1999 | Douglas et al. ................ 134/2 |
| 5,868,862 A | | 2/1999 | Douglas et al. .............. 134/26 |
| 5,908,510 A | | 6/1999 | McCullough et al. .......... 134/2 |
| 5,922,833 A | | 7/1999 | DeSimone .................. 528/490 |
| 5,944,996 A | | 8/1999 | DeSimone et al. ......... 210/634 |
| 5,976,264 A | | 11/1999 | McCullough et al. .......... 134/2 |
| 6,001,418 A | | 12/1999 | DeSimone et al. ......... 427/240 |
| 6,024,801 A | | 2/2000 | Wallace et al. ................ 134/1 |
| 6,030,663 A | | 2/2000 | McClain et al. ......... 427/389.9 |
| 6,067,728 A | | 5/2000 | Farmer et al. ................ 34/470 |
| 6,083,565 A | | 7/2000 | Carbonell et al. ....... 427/430.1 |
| 6,085,762 A | | 7/2000 | Barton ...................... 134/25.4 |
| 6,113,708 A | | 9/2000 | Hopple et al. .................. 134/7 |
| 6,149,828 A | | 11/2000 | Vaartstra ...................... 216/57 |
| 6,165,559 A | | 12/2000 | McClain et al. ......... 427/388.1 |
| 6,165,560 A | | 12/2000 | McClain et al. ......... 427/389.9 |
| 6,176,895 B1 | | 1/2001 | DeSimone et al. ........... 75/723 |
| 6,187,383 B1 | | 2/2001 | McClain et al. ......... 427/388.1 |
| 6,200,637 B1 | | 3/2001 | McClain et al. ............. 427/336 |
| 6,208,751 B1 | | 3/2001 | Almogy ...................... 382/149 |
| 6,224,312 B1 | | 5/2001 | Sundar ........................ 414/217 |
| 6,224,774 B1 | | 5/2001 | DeSimone et al. ......... 210/634 |
| 6,228,563 B1 | | 5/2001 | Starov et al. ............... 430/327 |
| 6,240,936 B1 | | 6/2001 | DeSimone et al. ........... 134/33 |
| 6,242,165 B1 | | 6/2001 | Vaartstra .................... 430/329 |
| 6,270,844 B2 | | 8/2001 | McClain et al. ............. 427/384 |
| 6,277,753 B1 | | 8/2001 | Mullee et al. ............... 438/692 |
| 6,287,640 B1 | | 9/2001 | McClain et al. ......... 427/388.1 |
| 6,296,711 B1 | | 10/2001 | Loan et al. .................. 118/726 |
| 6,298,902 B1 | | 10/2001 | DeSimone et al. ......... 164/131 |
| 6,306,564 B1 | | 10/2001 | Mullee ....................... 430/329 |
| 6,343,609 B1 | | 2/2002 | Kim .......................... 134/1.3 |
| 6,344,243 B1 | | 2/2002 | McClain et al. ......... 427/388.1 |
| 6,368,880 B2 | | 4/2002 | Singhvi et al. ................. 438/5 |
| 6,409,837 B1 | * | 6/2002 | Hillman ...................... 118/712 |
| 6,435,798 B1 | * | 8/2002 | Satoh ......................... 414/217 |
| 6,521,046 B2 | * | 2/2003 | Tanaka et al. .............. 118/715 |
| 2002/0020946 A1 | | 2/2002 | Hiraoka et al. ............. 264/485 |

OTHER PUBLICATIONS

Green Tweed MSE Seals for Medical and Analytical Equipment (website)—www.chemraz.com/corpnews–mseseals-formedical.htm; www.chemraz.com/FluidHandling/fluidintro.htm; and www.chemraz.com/FluidHandling/fhmseseals.htm (Apr. 29, 2002).

VAT—the leader in vacuum valves—www.vat.ch/en/pages/prod_descriptions02.htm (19 pages) (Apr. 28, 2002).

International Search Report for Corresponding PCT/US03/14586.

* cited by examiner

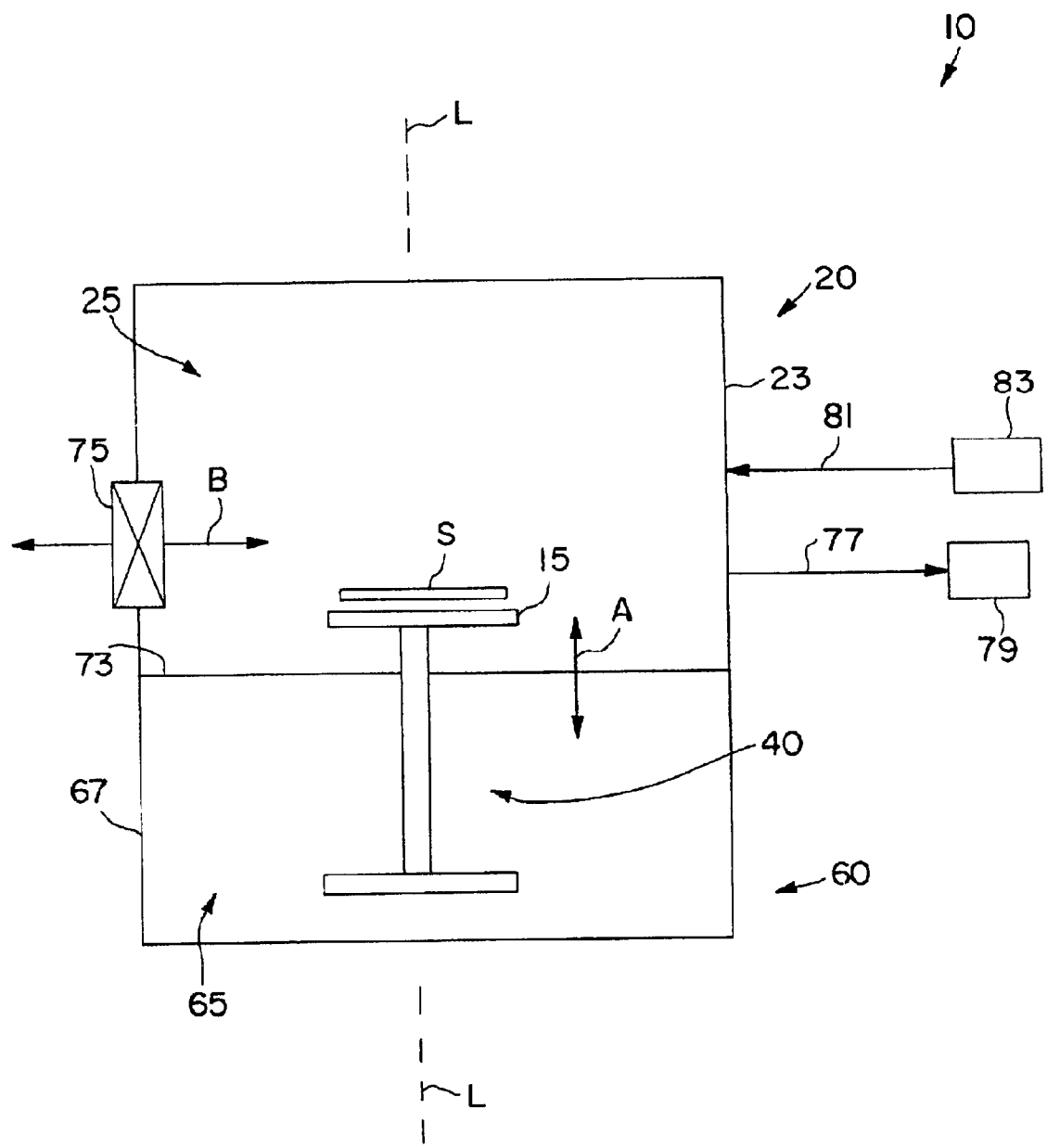
FIG. IA

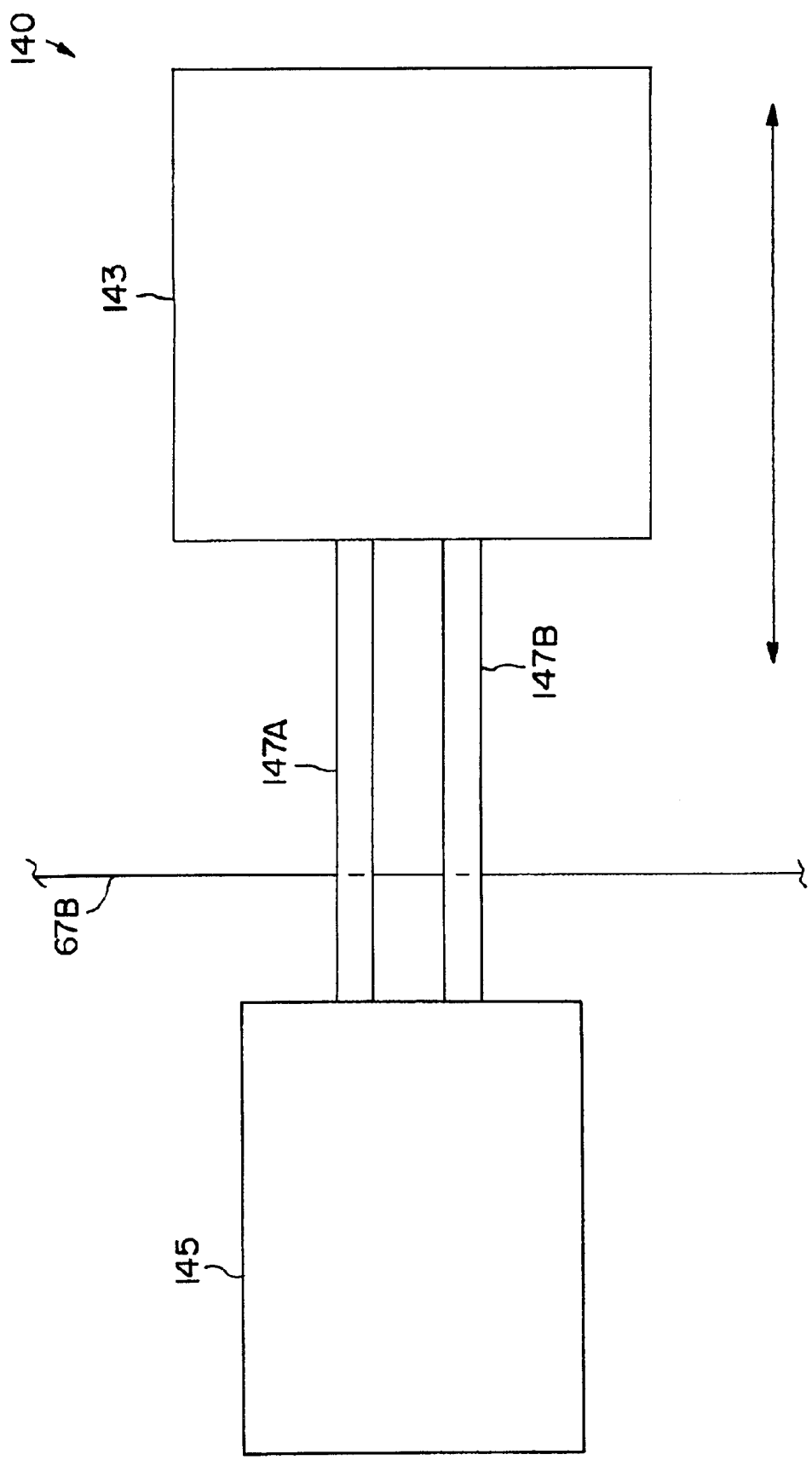

SUBSTRATE PROCESSING APPARATUS AND RELATED SYSTEMS AND METHODS

TECHNICAL FIELD

The present invention is generally related to the processing of substrates as part of, for example, a microscale device fabrication process. More particularly, the present invention relates to the processing (e.g., stripping, cleaning, drying, surface preparation, and the like) of substrates in a high-pressure environment that can be isolated from, yet functionally coupled with, an atmospheric or evacuated environment.

BACKGROUND ART

Microscale devices such as integrated circuits (ICs), optoelectronic, micromechanical, micro-electro-mechanical, and microfluidic devices contain micron- and sub-micron-sized features that are formed according to a precise sequence of fabrication steps and under tightly-controlled process conditions. Often a substrate such as a semiconductor wafer is provided, which contains active and passive electrical circuit elements such as transistors, resistors and capacitors. Semiconductor and thin-film deposition techniques are performed to change layers or add layers to the substrate. The layers added to the substrate or portions thereof can be permanent, as in the case of a conductive plane or electrode, an insulative barrier between conductive planes, a light-conductive waveguide, a structural layer used to form a micromechanical component, or an etchstop for controlling the effects of an etching process. Other layers or portions of layers can be temporary, as in the case of an intermediate sacrificial layer formed between the substrate and a structural layer that is subsequently removed to release such structural layer or a portion thereof from the substrate, or in the case of a photoresist layer formed on the substrate as a template for the creation of electronic or mechanical features. Many of the above-described layers are subjected to a removal process such as etching (which can occur isotropically, or anisotropically along a desired direction) to either completely remove the layer or to form: (1) features such as apertures, vias, microchambers, microfluidic channels, and trenches; (2) two-dimensional structures such as contacts, electrical leads, optical windows, and deflectable membranes; or (3) three-dimensional structures such as actuators and cantilevers. The removal of layers or portions of layers can also be accomplished by chemomechanical polishing or other surface micromachining techniques. The starting substrate employed during a fabrication process, for example a silicon or glass substrate, can itself be subjected to a bulk micromachining technique to form cavities or apertures therein. Additionally, transient layers such as photoresist materials can be removed in-part by development and in-whole by chemical stripping or by plasma ashing.

During the course of a fabrication process, one or more cleaning steps can be required to remove various types of contaminants or other undesired materials, or to otherwise prepare a surface for subsequent deposition of layers. For example, the top surface of a bulk starting material such as a substrate might initially be oxidized. The oxidation can render the surface of the substrate incompatible with a subsequent deposition procedure, in which case the oxidation would need to be removed in preparation for the deposition of an additional layer onto the substrate surface. In another example, the deposition of a metal layer onto a semiconductor substrate might require a preceding desorbing step to degas the substrate. Moreover, the removal of a photoresist layer, after a plasma ashing process for example, might leave residue, thereby requiring a cleaning step to remove such residue. In addition, the formation of micron-sized features such a deep trenches by etching might result in residues or particulates requiring removal. Polishing and planarization processes are other sources of residual contaminants. Various cleaning media have been employed. Of particular recent interest is the use of supercritical carbon dioxide ($CO_2$) to clean a substrate surface in a contained environment such as a processing chamber.

Many of the steps required during the course of a fabrication process occur within chambers or modules that are hermetically sealed from the ambient environment during use so as to maintain desired process conditions (e.g., pressure, temperature, electric field strength, flow rate). Depending on the particular process step being carried out, such chambers or modules are maintained at reduced pressure (e.g., plasma-enhanced deposition), atmospheric or near-atmospheric pressure (e.g., atmospheric pressure and low pressure chemical vapor deposition). Most deposition processes, however, are conducted in controlled atmospheres at reduced pressure, while conventional cleaning processes are conducted at ambient or near-ambient pressures (e.g., 0–20 pounds per square inch "gauge", psig). The respective facilities used for deposition and cleaning processes are separate, thus conventionally requiring that a given substrate be transferred from a deposition chamber to a remotely situated cleaning facility. Accordingly, the overall fabrication process flow is discretized, and usually requires that the substrate be exposed to the ambient environment in the interval between pre-cleaning and deposition, or between deposition and post-cleaning.

It would therefore be advantageous to provide a method and apparatus that enables substrates to be cleaned in a contained environment under conditions that are optimal for the cleaning process (e.g., high pressure), while at the same time integrates the cleaning process with the fabrication processes (which require different sets of optimal conditions) in a compatible manner, and without the need to transfer the substrate through the ambient environment.

DISCLOSURE OF THE INVENTION

In broad terms, the present invention comprises an apparatus and method for processing microelectronic substrates and the like. Generally, a first chamber is defined within a second chamber. The first chamber is connected to a first closure mechanism, and the second chamber is connected to a second closure mechanism. The first closure mechanism is designed to render the first chamber in a state that is either open or closed. The second closure mechanism is designed to render the second chamber in a state that is either open or closed. The first closure mechanism associated with the first chamber is mechanically referenced to the second chamber. The second closure mechanism associated with the second chamber is mechanically referenced to the second chamber.

In at least one embodiment of the invention, the first closure mechanism comprises a boundary movable within the second chamber for selectively opening and closing the first chamber in relation to the second chamber. In the closed state of the first chamber, this boundary has a role in structurally defining the interior of the first chamber, which interior is fluidly isolated from that of the second chamber. In one particularly advantageous embodiment, the boundary is associated with a substrate support or hold-down component (e.g., a wafer platen or chuck). In this latter case, the boundary thus also functions as part of a substrate movement (e.g., lifting) mechanism that is integral with the apparatus, thereby facilitating any substrate handling tasks (e.g., substrate transfer) to be performed in conjunction with the processing of the substrate. The second closure mechanism associated with the second chamber can provide a sealable interface between the second chamber and an environment external to the second chamber. As one example, the second closure mechanism comprises a gate valve or similar device.

The design of the apparatus allows the inner volume of the second chamber to contain and maintain a controlled atmosphere of an appropriate gas (e.g., nitrogen) at substantially ambient pressure when the second chamber is either open or closed and the first chamber is either open or closed. The design of the apparatus further allows the inner volume of the second chamber to contain and maintain a controlled atmosphere of gas at substantially ambient pressure or sub-atmospheric pressure when the second chamber is closed and the first chamber is either open or closed. Moreover, the design of the apparatus allows the first chamber, when closed, to contain and maintain an appropriate processing medium at pressures higher than ambient pressure (e.g., up to about 5000 psig), while the second chamber is maintained at or near atmospheric pressure or at vacuum.

The first chamber is designed to receive one or more substrates. In at least one embodiment, a substrate is transferred to the first chamber by consecutively actuating the second closure mechanism and the first closure mechanism. For example, the second closure mechanism is opened, the substrate is transferred through the opened second closure mechanism and into the first chamber, the substrate is loaded into the first chamber, and the first closure mechanism is closed. In the above-described embodiment where a movable boundary is provided for supporting and moving the substrate, the substrate is transferred through the opened second closure mechanism and loaded onto the boundary, and the boundary is moved through the second chamber into a closed state. At this closed state, the substrate is confined within the first chamber and is fluidly segregated from the second chamber.

The second chamber can be designed to be mechanically connected to a third chamber in a leak-tight fashion. For example, the second closure mechanism could serve as an interface between the second chamber and a substrate transfer module. The third chamber (e.g., substrate transfer module) could contain a substrate-handling robot in a controlled atmosphere that is maintained at ambient or sub-atmospheric pressure. By this configuration, the second chamber can function as a buffer chamber between a high-pressure first chamber and an ambient-pressure or sub-atmospheric pressure third chamber.

According to one embodiment of the present invention, an apparatus for processing a microelectronic substrate comprises a main chamber, a sub-chamber for containing the microelectronic substrate, and a fluid conduit. The main chamber comprises a main chamber wall enclosing a main chamber interior. The sub-chamber is disposed within the main chamber, and comprises a sub-chamber wall enclosing a sub-chamber interior. The sub-chamber comprises a boundary, and the sub-chamber interior is adapted for fluid isolation from the main chamber. The fluid conduit is formed through the main chamber wall and communicates with the sub-chamber interior.

According to one aspect of this embodiment, the boundary of the sub-chamber wall comprises a substrate support surface that is movable in relation to a sub-chamber interior surface. Alternatively, the boundary comprises a sub-chamber interior surface that is movable in relation to a substrate support surface. As another alternative, the boundary comprises both a substrate support surface and a sub-strate interior surface, which surfaces are movable in relation to each other.

According to another embodiment of the invention, an apparatus for processing a microelectronic substrate comprises a main chamber and a movable boundary. The main chamber comprises a main chamber wall enclosing a main chamber interior. The movable boundary is disposed within the main chamber interior, and is movable between a first position and a second position. At the first position, the movable boundary at least partially defines a sub-chamber fluidly isolated from the main chamber interior.

According to yet another embodiment of the invention, an apparatus for processing a microelectronic substrate comprises a main chamber, a substrate support device, and a fluid conduit. The main chamber comprises a main chamber wall enclosing a main chamber interior, and an interior surface. The substrate support device is movable within the main chamber interior between an open position and a closed position. The substrate support device comprises a substrate support surface. At the closed position, the substrate support surface and the interior surface of the main chamber at least partially define a sub-chamber that is fluidly isolated from the main chamber interior. The fluid conduit extends through the main chamber wall in communication with the sub-chamber. According to one aspect of this embodiment, the apparatus further comprises a backstop device that is mechanically referenced to the main chamber wall. Preferably, the backstop device comprises an actuator, a restraint member, and a compliant linkage intercoupling the actuator and the restraint member. As described in detail hereinbelow, the backstop device is useful in maintaining the sealed environment contained by the sub-chamber.

According to still another embodiment of the invention, an apparatus for processing a microelectronic substrate comprises a movable substrate support structure, a processing chamber, a main chamber, and an actuator. The movable substrate support structure comprises a substrate support surface and a sealing element. The processing chamber is bounded by the substrate support surface and the sealing element. The main chamber surrounds, or at least is adjacent to, the processing chamber and encloses a main chamber interior. The main chamber interior is fluidly sealable from an environment external to the main chamber and the processing chamber. The actuator is coupled to the substrate support surface, and controls the processing chamber between an open state and a closed state. At the closed state, the sealing element provides a fluidly isolated boundary between the processing chamber and the main chamber and, at the open state, the substrate support surface is exposed to the main chamber interior.

In accordance with certain embodiments of the invention, at least a portion of the substrate support device is constructed from a high-yield strength material. Preferably, the high-yield strength material is characterized by a yield strength of approximately 120 MegaPascals (MPa) or greater, such as SA-723 steel. Additionally, in these or other embodiments, the interior surface of the main chamber wall and the substrate support surface are constructed from or treated with a corrosion-resistant material, such as HAS-TELLOY® C-22 or C-276 (available from Haynes International, Inc., Kokomo, Iowa, United States of America), AL-6XN® (available from Allegheny Ludlum Corporation, Pittsburgh, Pa., United States of America), alloy 25-6Mo, nickel plating or cladding, polytetrafluoroethylene (PTFE), or perfluoroalkoxy (PFA).

According to a further embodiment of the invention, an apparatus for processing substrates is adjustable between a substrate processing mode and a substrate access mode. The apparatus comprises a main chamber, an interface component, and a boundary. The main chamber comprises a main chamber wall enclosing a main chamber interior. The interface component is mounted to the main chamber and is operable between an open state and a closed state. At the open state, the interface component permits access into the main chamber interior from an environment external to the main chamber. At the closed state, the interface component seals the main chamber from the external environment. The boundary is movable within the main chamber to a first position corresponding to the substrate processing mode, and alternately to a second position corresponding to the substrate access mode. At the first position, the boundary at least partially defines a pressurizable sub-chamber sealingly segregated from the main chamber interior and adapted to confine a substrate. At the second position, the boundary permits the substrate to be transferred into and out from the main chamber through the open-state interface component.

As described in detail hereinbelow, the invention enables the substrate processing apparatus to be coupled to other modules employed for substrate transfer and fabrication purposes. Moreover, the embodiments of the invention can be directly coupled to either atmospheric- or vacuum-operated modules. Therefore, according to an additional embodiment of the invention, the apparatus further comprises a substrate handling module that encloses the environment external to the main chamber. In this embodiment, the interface component intercouples the main chamber and the substrate handling module. In one aspect of this embodiment, the substrate handling module comprises a substrate transfer chamber and a robotic end effector disposed therein. The interface component is adapted for accommodating movement of the end effector through the interface component, and thus to and from the substrate transfer chamber and the main chamber interior.

The present invention also provides a method for processing a microelectronic substrate. In accordance with this method, an apparatus is provided that comprises a main chamber and a sub-chamber. The main chamber comprises a main chamber wall enclosing a main chamber interior. The sub-chamber comprises a sub-chamber wall enclosing a sub-chamber interior, and is disposed within the main chamber interior. The sub-chamber wall comprises a boundary. A microelectronic substrate is introduced into the sub-chamber interior. The sub-chamber interior is fluidly isolated from the main chamber interior. A processing medium is introduced into the sub-chamber interior. The processing medium pressurizes the sub-chamber interior to a greater than atmospheric pressure and contacts the substrate.

It is therefore an object of the present invention to provide a method and apparatus for creating a fluidly isolated sub-chamber within a larger chamber, wherein the sub-chamber can be pressurized with a processing medium while the larger chamber is maintained at low-pressure, atmospheric, or vacuum conditions.

It is another object of the present invention to provide a method and apparatus for integrating the respective tools utilized in the cleaning and fabrication of substrates and devices formed on substrates, thereby combining cleaning and fabrication procedures in a continuous process flow.

It is yet another object of the present invention to realize such integration through the direct coupling of the respective cleaning and fabrication tools, such that the substrate being processed is not subjected to ambient conditions between the cleaning and fabrication steps.

The foregoing objects, and other objects, are achieved in whole or in part by the present invention.

Some of the objects of the invention having been stated hereinabove, other objects will become evident as the description proceeds when taken in connection with the accompanying drawings as best described hereinbelow.

BRIEF DESCRIPTION OF THE DRAWINGS

FIG. 1A is a schematic view of a substrate processing apparatus provided in accordance with the present invention, in which the apparatus is positioned at a substrate loading/removal state;

FIG. 5 is a top plan view of a backstop mechanism included with the substrate processing apparatus in accordance with the present invention;

DETAILED DESCRIPTION OF THE INVENTION

Figure 1B:
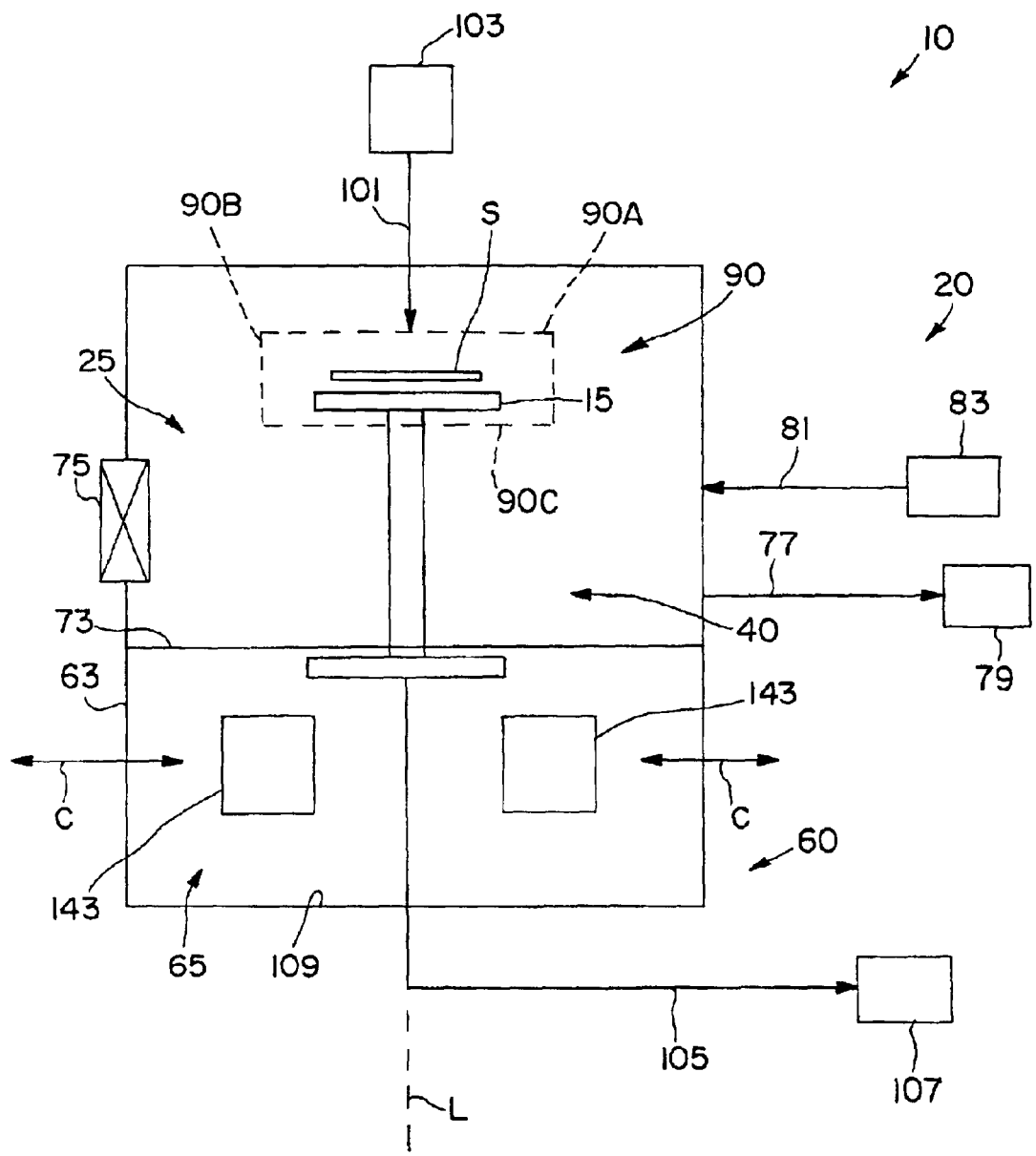
FIG. 1B is a schematic view of the substrate processing apparatus illustrated in FIG. 1A, in which the apparatus is positioned in a high-pressure processing state.

For the purposes of the present disclosure, the term "communicate" (e.g., a first component "communicates with" or "is in communication with" a second component) is used herein to indicate a structural, functional, mechanical, optical, or fluidic relationship, or any combination thereof, between two or more components or elements. As such, the fact that one component is said to communicate with a second component is not intended to exclude the possibility that additional components may be present between, and/or operatively associated or engaged with, the first and second components.

As used herein, the terms "atmospheric pressure", "substantially atmospheric pressure", and "near atmospheric pressure" are taken to mean a pressure equal or substantially equal to the ambient pressure of the environment external to the apparatus and/or system provided by the present invention. It will thus be understood that the precise value for atmospheric pressure may vary depending on, for example, the elevation at which the apparatus or system resides, or depending on the environmental conditions maintained in a facility in which the apparatus and/or system is installed. For instance, atmospheric pressure at sea level is generally understood as being equal to 14.7 psi absolute (psia) or 0 psi gauge (psig), whereas at higher elevations the value for atmospheric pressure will be a somewhat lesser value. Moreover, as used herein, the term "atmospheric pressure" is considered to also encompass a small positive pressure (e.g., between approximately 0 and approximately 20 psig) that may result in a case where a fluid, such as an appropriate purging fluid (e.g., $N_2$), is circulated through an enclosed volume as described hereinbelow.

For convenience, the term "microelectronic substrate" is used generically herein to encompass a wide variety of microscale workpieces that are processed according to traditional integrated circuit (IC) fabrication techniques and well as modern adaptations of such techniques as in the field of micromachining. By way of example, but without limiting the scope of the invention, the "microelectronic substrate" can include a single substrate; a combination of substrates bonded together such as by anodic or adhesive bonding; and a base substrate in combination with one or more layers or films deposited or otherwise formed thereon (e.g., conductive, dielectric, semiconducting, sacrificial, epitaxial, lattice-matching, adhesive, or structural layers), and/or in combination with one or more microscale structural or masking features fabricated by additive techniques (e.g., film deposition, thermal oxidation, nucleation, electroplating, spin-on coating) and/or removal techniques (e.g., wet etching, dry etching, deep reactive ion etching or DRIE, ion bombardment, polishing, planarization, drilling), and/or substitutive or implantation techniques such as doping.

The "microelectronic substrate" can be a precursor or source material such as bulk silicon, or a wafer sliced from a silicon boule, or a die produced from a wafer. The "microelectronic substrate" can constitute a work-in-progress at some intermediate stage, or a completed or nearly completed device. The "microelectronic substrate" can be a device or instrument such as an IC chip with logic circuitry or data storage devices; a "system on a chip" combining data processing and system functions such as sensing and transmitting on a single substrate; a microfluidic chip or "lab on a chip" for handling capillary-scale liquid flows or stamping biological sample arrays; a light-emitting diode (LED) or laser diode (LD); a micro-electro-mechanical systems (MEMS) device (e.g., relay switch, gyroscope, accelerometer, capacitive pressure sensor, micropump, inkjet nozzle); a micro-opto-electro-mechanical systems (MOEMS) device (e.g., waveguide, variable optical attenuator or VOA, optical shutter); an opto-electronic device; a photonic device; a flat panel display; or a semiconductor-based biosensor or chemosensor.

The material composition of the "microelectronic substrate" is not intended to be limited in any manner. Non-limiting examples include semiconductors, metals, and dielectrics. Further examples within these various genera include silicon; silicon-containing compounds (e.g., oxides, carbides, nitrides, and oxynitrides of silicon); Group III–V compounds (e.g., GaN, AlN, InGaN); silicon-on-insulators (SOI's); sapphire; polymers such as photoresist compositions; glass; quartz; various oxides; and others. The crystallography of the "microelectronic substrate" or any component thereof can be predominantly single crystalline, polycrystalline, or amorphous.

As used herein, the terms "dense $CO_2$", "dense carbon dioxide", "densified $CO_2$" and "densified carbon dioxide" are used interchangeably and mean carbon dioxide that has a density (g/ml) greater than that of carbon dioxide gas at 1 atm and 20° C. The terms also mean carbon dioxide, which is normally a gas at standard or room temperature and pressure (STP), placed under a pressure generally exceeding about 800 psi at about 21° C.

Generally, densified carbon dioxide is carbon dioxide that has been placed under greater than atmospheric pressure or low temperature to enhance its density. In contrast to carbon dioxide used in pressurized canisters to deliver foamed products, e.g., fire extinguishers or shaving creams, densified carbon dioxide is preferably maintained at much greater pressures, e.g., about 800 psi and greater. It has been found that density, rather than temperature or pressure alone, has much greater significance for enhancing the solvent-like properties of carbon dioxide. See, Brogle, (1982) Chem. Ind.-London 37:385–390, incorporated herein by reference.

As used herein, the terms "supercritical" and "supercritical phase" refer to a condition in which a substance, such as carbon dioxide, exceeds a critical temperature (e.g., 31° C. for carbon dioxide) and pressure (e.g., 71 atm for carbon dioxide), at which point the material cannot be condensed into the liquid phase despite the addition of further pressure.

As used herein, the terms "liquid carbon dioxide" and "liquid $CO_2$" are used interchangeably to mean carbon dioxide in liquid form. Carbon dioxide takes a liquid form when subjected to a pressure of at least about 5.11 bar (corresponding to the triple point) in a temperature range between about 216.8 K (corresponding to the triple point) and about 304.2 K (corresponding to the critical point). Liquid carbon dioxide has a density between about 0.7 and about 1.2 g/ml and a viscosity of about 0.07 mN/m². Liquid carbon dioxide can be distinguished from other phases of carbon dioxide based on its surface tension, which is about 5 dynes/cm for liquid carbon dioxide.

As used herein, the term "supercritical fluid carbon dioxide" means carbon dioxide which is at or above the critical temperature of 31° C. and the critical pressure of 71 atmospheres and which cannot be condensed into a liquid phase despite the addition of further pressure.

Densified carbon dioxide, preferably liquid or supercritical fluid carbon dioxide, can be employed in the methods and apparatuses of the present invention. It is noted that other molecules having densified properties can also be employed alone or in mixture. These molecules include, but are not limited to, methane, ethane, propane, ammonia, butane, n-pentane, n-hexane, cyclohexane, n-heptane, ethylene, propylene, methanol, ethanol, isopropanol, benzene, toluene, p-xylene, sulfur dioxide, chlorotrifluoromethane, trichlorofluoromethane, perfluoropropane, chlorodifluoromethane, sulfur hexafluoride, ozone and nitrous oxide.

As used herein, the term "fluid" is taken to mean any phase of matter that is not predominantly a solid. While a solid can resist the application of a shear stress by static deformation, a fluid cannot do so. As long as a fluid is subjected to a shear stress, the fluid will respond by moving and/or deforming. Thus, the term "fluid" encompasses, by way of example, flowable media such as liquids, vapors, and gases. In addition, the term "fluid" encompasses supercritical fluids. Moreover, the term "fluid" encompasses mixtures of liquids, vapors, gases, and supercritical fluids with solid particulate matter, as in the case of particles carried in a fluid flow stream.

As used herein, the term "processing medium" is generally taken to mean any fluid suitable for contacting a substrate for the purpose of performing a procedure on the substrate.

As used herein, the term "high pressure" generally encompasses pressures ranging from a nominal positive pressure above standard atmospheric pressure (0 psig) to approximately 5000 psig.

As used herein, the term "vacuum" generally encompasses pressures ranging from approximately $10^{-7}$ Torr up to atmospheric pressure.

As used herein, the term "processing" is taken to mean any procedure carried out on a substrate, including fabrication processes (e.g., addition of layers; removal of layers, portions of layers, or portions of the substrate lithography; metallization; deposition; and the intentional doping of the substrate or layers with impurities); treatment processes (e.g., annealing, sintering, heating, coating, plating, stress or strain relieving); stripping processes (e.g., removal of photoresist); cleaning processes (e.g., removal of post-etch residue, anti-reflective coatings, or other residues, contaminants or transient materials used in the manufacture of microelectronic components); and drying processes (e.g., removal of tenacious surface fluid).

As used herein, the term "high-strength material" means any material having a yield strength of approximately 120 MPa or greater, with one non-limiting example being SA-723 steel.

As used herein, the term "corrosion-resistant material" means any material resistant to undesirable reactions resulting from contact with a processing medium such as a cleaning fluid. The "corrosion-resistant material" can constitute a solid body (e.g., stainless steel, HASTELLOY® grade alloys such as C-22 and C-276, superaustentic stainless steels such as AL-6XN® and alloy 25-6M, duplex stainless steels, MONEL® alloys (available from Inco Alloys International, Inc., Huntington, W. VA., United States of America), ferrous metal materials comprising at least about 8% by wt. of nickel or at least about 10% by wt. of chromium, or applied barrier coatings or treatments. Non-limiting examples of suitable applied barrier materials include polytetrafluoroethylene (PTFE), polyetheretherketone (PEEK), perfluoroalkoxy (PFA), polymonochlorotrifluoroethylene (PCTFE), polyvinylidene fluoride (PVDF), fluorinated semi-crystalline polymers, thin films/platings/claddings with nickel or chromium or nickel-chromium alloys.

Figure 2A:
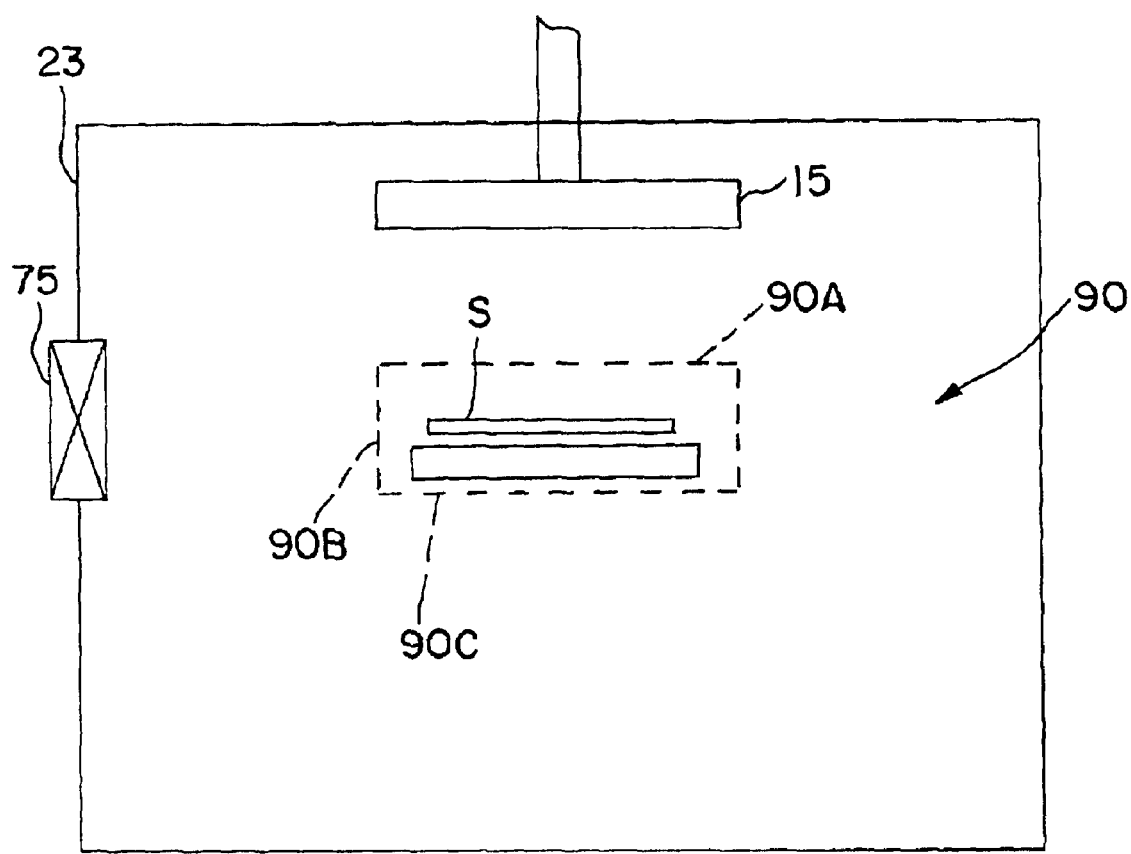
FIGS. 2A and 2B are schematic elevation views of alternative embodiments of the substrate processing apparatus illustrated in FIGS. 1A and 1B, showing alternative methods by which a pressurizable sub-chamber can be created within and isolated from a surrounding main chamber.

Referring now to the Figures, wherein like reference characters refer to like parts throughout, and particularly referring to FIGS. 1A, 1B and 2A, a substrate processing apparatus, generally designated 10, is schematically illustrated in accordance with the invention. Substrate processing apparatus 10 is preferably operable in either of two distinct operational states—a substrate loading/removal state or a high-pressure substrate processing state—and is adjustable between these two states. FIG. 1A depicts substrate processing apparatus 10 in the substrate loading/removal state. FIG. 1B depicts substrate processing apparatus 10 in the substrate processing state.

Continuing with FIGS. 1A and 1B, substrate processing apparatus 10 broadly comprises a main chamber, generally designated 20, and a boundary 15 movable within main chamber 20. In a preferred embodiment, movable boundary 15 is provided by a substrate support surface connected to a movable substrate support device, generally designated 40. Main chamber 20 comprises a main chamber structure 23 that defines a main chamber interior, generally designated 25. Substrate support device 40 is adapted to support a substrate S such as a wafer. Substrates S provided in the form of wafers typically have 200 mm or 300 mm diameters. However, the invention is not limited to handling such standard sizes and can contain substrates ranging from approximately 50 to 450 mm in diameter. The substrate S can constitute a microelectronic substrate as broadly defined hereinabove, with or without films, layers or microscale features fabricated thereon. In the illustrated preferred embodiment, substrate support device 40 moves vertically within main chamber interior 25 between a lowered position (corresponding to the substrate loading/removal state illustrated in FIG. 1A) and a raised position (corresponding to the high-pressure substrate processing state illustrated in FIG. 1B). Hence, the preferred movement of substrate support device 40 occurs generally along, or in parallel with, a central longitudinal axis L of main chamber interior 25, as illustrated by arrow A.

Continuing with FIGS. 1A and 1B, substrate processing apparatus 10 also preferably comprises a lower chamber, generally designated 60. At least a portion of substrate support device 40 is confined within lower chamber 60. Lower chamber 60 comprises a lower chamber structure 67 that defines a lower chamber interior, generally designated 65. In a preferred embodiment, lower chamber interior 65 is physically and fluidly separated from main chamber interior 25 by a partition means such as a plate 73 transversely oriented with respect to longitudinal axis L. A suitable sealing component such as a bellows 74 (see FIGS. 3B–4D) ensures isolation of lower chamber interior 65 from main chamber interior 25. Lower chamber 60 is thus advantageously provided to prevent the migration of contaminant material into main chamber interior 25. Such contaminant material can be produced as a result of the operation of components moving within lower chamber 60 as described hereinbelow. As best seen in FIGS. 3B–4D, bellows 74 also isolates main chamber 20 from the environment external to substrate processing apparatus 10.

Continuing with FIGS. 1A and 1B, substrate processing apparatus 10 further comprises a interface component 75, such as a vacuum gate valve slit and accompanying valve device, which provides a sealed interface between main chamber interior 25 and the environment external to substrate processing apparatus 10. Valve devices suitable for implementation as interface component 75 are available from VAT Vakuumventile AG, CH-9469, Haag, Switzerland. Interface component 75 can be opened to admit a substrate-handling device such as a robotic component (not shown in FIGS. 1A and 1B). When interface component 75 is in its open state, the substrate-handling device can reach into main chamber interior 25 to load substrate S onto substrate support device 40 and, after substrate S has been processed, remove substrate S from main chamber interior 25. The movement of such a substrate support device through interface component 75, and into and out from main chamber interior 25, is represented by arrow B.

The external environment referred to hereinabove could be the ambient environment. More advantageously, however, interface component 75 serves as a hermetic, direct interface between substrate processing apparatus 10 and another substrate handling and/or processing module. In accordance with the invention, substrate processing apparatus 10 can be coupled to a module that operates at either an internal atmospheric pressure or a vacuum. Thus, for example, interface component 75 could provide fluid communication between main chamber interior 25 and the evacuated interior of the central transfer chamber of a cluster tool, or an atmospheric robot forming a part of an equipment front end module (EFEM). To accommodate the direct coupling of main chamber interior 25 with either an atmospheric or vacuum environment, substrate processing apparatus 10 includes an exhaust line 77 for plumbing main chamber interior 25 to a suitable vacuum source and/or vent source 79. Accordingly, main chamber 20 can be evacuated prior to opening interface component 75 in preparation for fluidly coupling main chamber 20 to another evacuated environment. Alternatively, main chamber 20 can be maintained at atmospheric pressure or at a positive gauge pressure when it is desired to purge main chamber 20 of contaminants or to prevent contamination of substrate S. For the latter purpose, substrate processing apparatus 10 can include a conduit 81 for plumbing a stream of inert gas such as nitrogen into main chamber from an inert gas supply source 83. The inert gas can then be routed from main chamber interior 25 through the exhaust line 77 connected to the vacuum source or venting device 79. Also in the case where substrate processing apparatus 10 is coupled to an atmospheric module, interface component 75 can serve as a secondary seal to the atmospheric module should a leak occur during the high-pressure cleaning process described hereinbelow.

FIG. 1B depicts substrate processing apparatus 10 in the high-pressure substrate processing state. As described in more detail hereinbelow, substrate processing apparatus 10 is designed to create a sub-chamber, generally designated 90, disposed within main chamber 20. Sub-chamber 90 is capable of withstanding high pressures (e.g., as high as approximately 5000 psi gauge) while, at the same time, is maintained in fluidic isolation from the controlled, high-purity mini-environment maintained by main chamber 20. Sub-chamber 90 is enclosed by an upper sub-chamber surface 90A, one or more lateral sub-chamber surfaces 90B, and a lower sub-chamber surface 90C. In the case where substrate S is a circular or substantially circular wafer, a single, continuous lateral sub-chamber surface 90B is provided to sweep out a cylindrical volume defining the interior of sub-chamber 90. The preferred cylindrical profile of this interior approximates the circular shape of substrate S, and the inside diameter of the interior is slightly larger than the diameter of substrate S. This configuration minimizes the required volume of sub-chamber S, promotes uniform distribution of processing media (e.g., cleaning fluids) to the surface of substrate S, and thereby improves the efficiency and efficacy of the desired processing events.

Continuing with particular reference to FIG. 1B, in order to render substrate processing apparatus 10 adjustably operable between its substrate loading/removal state and substrate processing state, at least one of the surfaces enclosing sub-chamber 90 (e.g., movable boundary 15 described hereinabove with reference to FIG. 1A), or at least a portion of such surface, is movable into sealing engagement with one or more of the other surfaces enclosing sub-chamber 90. Thus, in the illustrated preferred embodiment, upper sub-chamber surface 90A and lateral sub-chamber surface 90B are fixed, and lower sub-chamber surface 90C is movable into engagement with lateral sub-chamber surface 90B. In the preferred embodiment, lower sub-chamber surface 90C is associated with substrate support device 40 and comprises a substrate support surface as well as any base component on which the substrate support surface is mounted (see, e.g., movable chamber base 45 illustrated in FIGS. 3B–4D). Sub-chamber 90 is thus preferably established by elevating substrate support device 40—and thus substrate S itself—to a raised position at which substrate S is sealingly confined within sub-chamber 90.

Figure 2B:
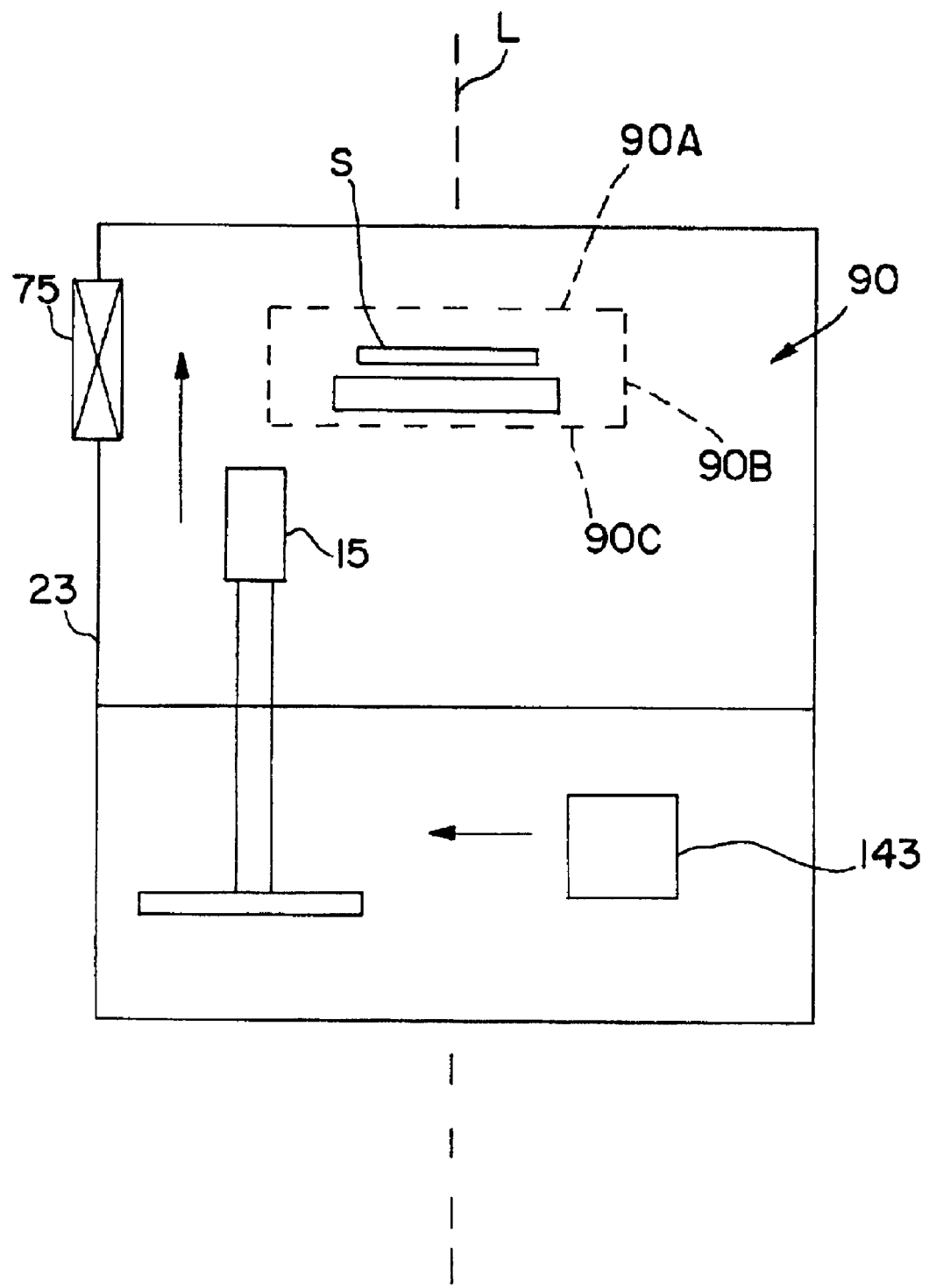
Figure 2C:
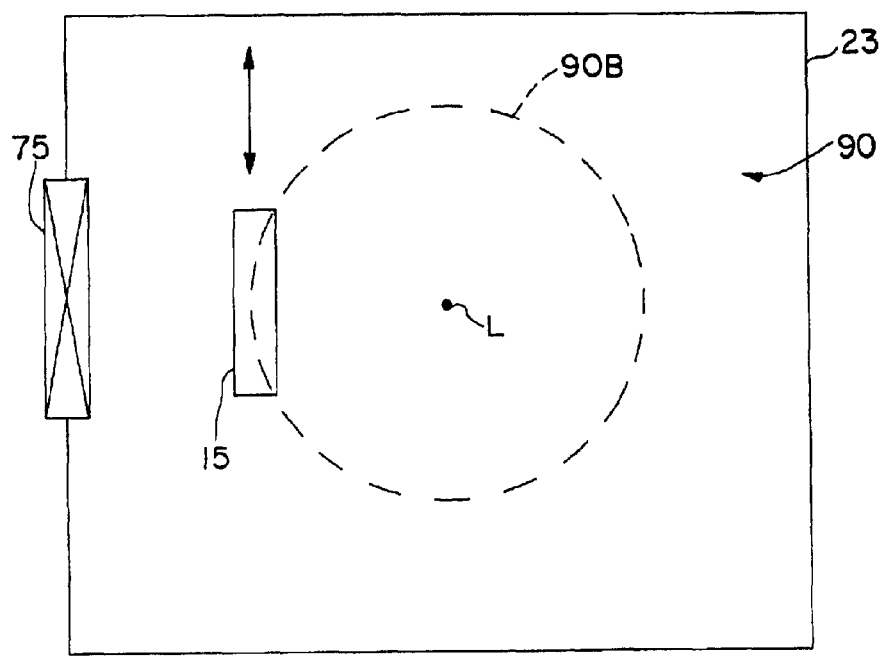
FIGS. 2C and 2D are schematic top plan views of alternative embodiments of the substrate processing apparatus illustrated in FIGS. 1A and 1B, showing additional alternative methods by which a pressurizable sub-chamber can be created within and isolated from a surrounding main chamber.
Figure 2D:
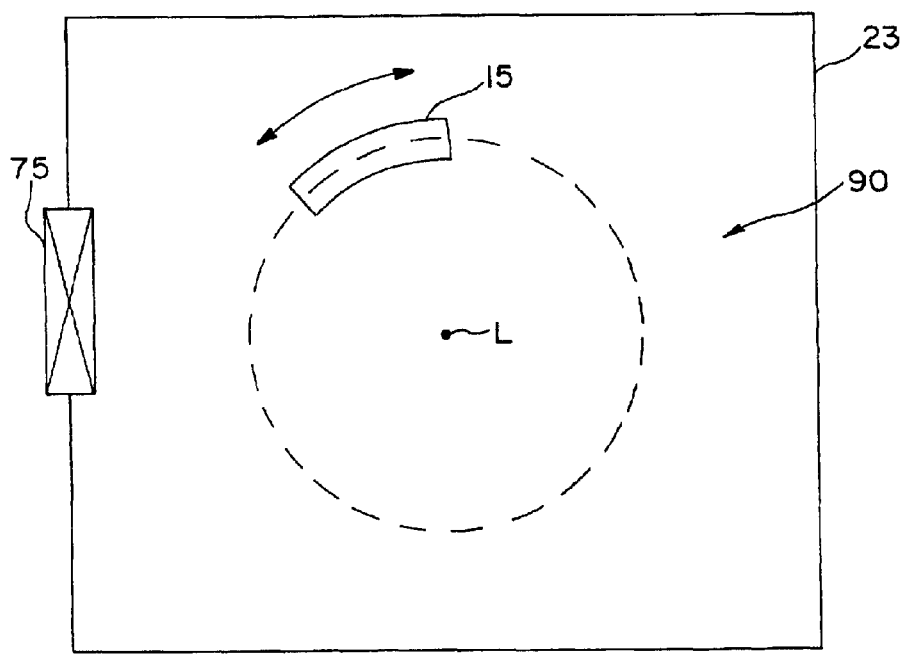

Substrate processing apparatus 10 is not limited to the embodiment illustrated in FIGS. 1A and 1B, wherein lower sub-chamber surface 90C constitutes movable boundary 15 and movable boundary 15 is mechanically referenced to substrate support device 40. Alternative arrangements provided by the invention are illustrated by way of non-limiting examples in the simplified drawings of FIGS. 2A–2D. In these alternative arrangements, movable boundary 15 is independent of substrate support device 40 such that substrate support device 40 is not required to function as a substrate lifting mechanism. In FIG. 2A, lateral sub-chamber surface 90B and lower sub-chamber surface 90C of sub-chamber 90 are stationary, and movable boundary 15 is actuated downwardly into sealing engagement with lateral sub-chamber surface 90B to provide upper sub-chamber surface 90A of sub-chamber 90. In FIG. 2B, movable boundary 15 is a door or gate that is actuated along a direction parallel to longitudinal axis L to close an opening in lateral sub-chamber surface 90B. In FIG. 2C, movable boundary 15 is a door or gate that is actuated in a direction generally tangential to longitudinal axis L and in parallel with the plane on which substrate S rests (i.e., the plane of the sheet containing FIG. 2C). In FIG. 2D, movable boundary 15 is actuated to rotate along a curvilinear path with respect to longitudinal axis L.

A particularly advantageous substrate process enabled by the invention is a high-pressure substrate cleaning process. The high-pressure substrate cleaning process generally involves exposing substrate S, or at least a surface thereof, to a processing medium that preferably is a densified fluid such as supercritical $CO_2$, liquid $CO_2$, or other chemistries as delineated by way of example hereinabove. For this purpose, and referring back to FIG. 1B, substrate processing apparatus 10 provides a processing medium supply line 101 directed into sub-chamber 90 for conducting processing media from a processing medium supply source 103. A processing medium return line 105 is also provided to conduct the fluid, and any contaminating particulates carried by the fluid, out from substrate processing apparatus 10 to a processing medium return circuit 107. Preferably, processing medium return line 105 extends through the body of substrate support device 40.

Once sub-chamber 90 is charged to a high pressure with the processing medium, a significant pressure-differential develops between sub-chamber 90 and main chamber 20. The powered actuator (not shown in FIGS. 1A and 1B, but described hereinbelow) employed to move substrate support device 40 to its raised position can be used to assist in maintaining the closure of sub-chamber 90 against the forces imparted by the high-pressure interior of sub-chamber 90. In addition, the raised position of substrate support device 40 is preferably associated with an increased clearance between a lower end of substrate support device 40 and a lower end 109 of lower chamber 60. More preferably, and as described in detail hereinbelow, a backstop mechanism 140 (see FIGS.

4A–5) is provided for inserting a restraint member or members 143 into this increased clearance to assist in maintaining substrate support device 40 in its raised position, thereby maintaining the sealed, high-pressure environment defined by sub-chamber 90 and relieving the axial load borne by substrate support device 40 and/or the load borne by a mechanism driving substrate support device 40. Movement of restraint members 143 radially inwardly to a restraining position and radially outwardly to a non-active position is represented by arrows C.

Figure 3A:
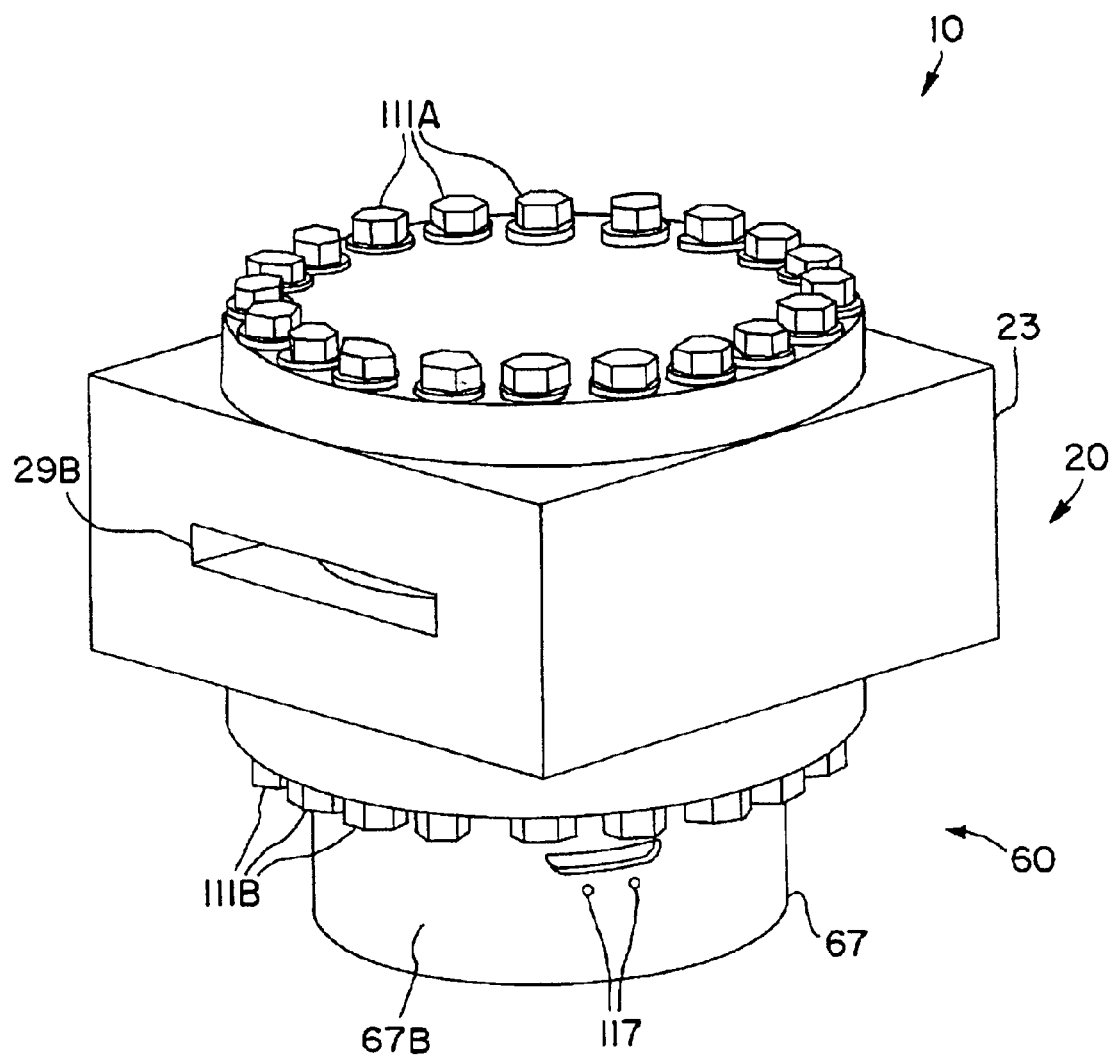
FIG. 3A is a perspective view of the substrate processing apparatus structured according to a preferred embodiment of the present invention.
Figure 3B:
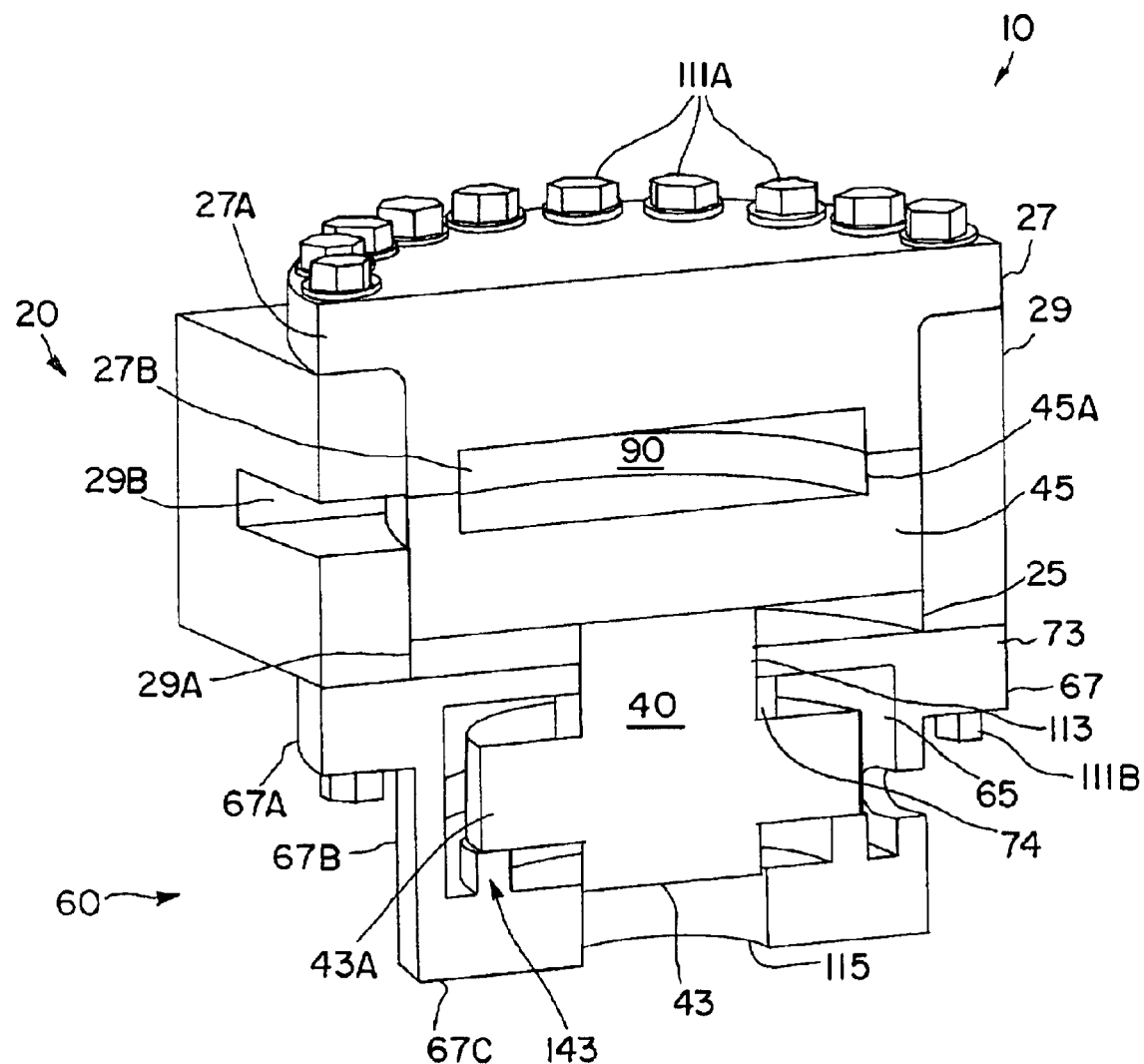
FIG. 3B is a perspective cutaway view of the preferred embodiment illustrated in FIG. 3A.

Referring now to FIGS. 3A and 3B, a preferred structural configuration for substrate processing apparatus 10 is illustrated. As best shown in FIG. 3B, substrate processing apparatus 10 is positioned to operate in the substrate processing state in which sub-chamber 90 exists within main chamber 20. Preferably, sub-chamber 90 has a volume ranging from approximately 10 ml to approximately 10 L, and a diameter ranging from approximately 50 mm to approximately 450 mm. Main chamber structure 23 of substrate processing apparatus 10 comprises an upper section 27 serving as a main chamber lid, a lateral section or main chamber wall 29, and medial plate 73, all of which cooperate to enclose main chamber interior 25. Lateral section 29 of main chamber 20 preferably has an inside lateral surface 29A that at least partially defines main chamber interior 25. As depicted, inside lateral surface 29A is cylindrical about the central longitudinal axis of main chamber interior 25. This cylindrical profile improves gas flow through main chamber interior 25 and, by minimizing the number of sharp structural features, prevents the accumulation of contaminant material within main chamber 20. An aperture 29B formed through lateral section 29 provides access between interface component 75 (see FIGS. 1A–2D) and main chamber interior 25. Lower chamber structure 67 encloses a lower chamber interior 65 and comprises a flanged region 67A, a lateral region 67B, and an outer end region 67C. In a manner analogous to the construction of pressure vessels, the primary structure of substrate process apparatus 10 is assembled by securing together upper section 27, lateral section 29, medial plate 73, and lower chamber 60 by suitable fasteners 111A and 111B. Fasteners 111A and 111B can comprise, for example, high-strength bolts oriented in parallel with the longitudinal axis of main chamber interior 25 and threaded into a flanged region 27A of upper section 27 of main chamber structure 23 and flanged region 67A of lower chamber structure 67. Preferably, upper section 27 and lateral section 29 are constructed from a high-strength material to withstand the high pressure developed in sub-chamber 90. One example of a suitable high-strength material is SA-723 Steel.

As most clearly illustrated in FIG. 3B, substrate support device 40 preferably comprises an axially oriented elongate member such as a shaft 43, and a chamber base 45 attached to the upper end of shaft 43. Both medial plate 73 and outer end region 67C of lower chamber structure 67 have centrally disposed axial bores 113 and 115, respectively, through which shaft 43 moves. Shaft 43 includes an enlarged-diameter section 43A, which could be an annular component press-fitted onto shaft 43. The range of movement of enlarged-diameter section 43A is confined to lower chamber interior 65 between medial plate 73 and outer end region 67C. If substrate support device 40 moves downwardly in reaction to the forces imparted by the pressurized interior of sub-chamber 90, enlarged-diameter section 43A comes into contact with backstop restraint members 143. Backstop restraint members 143 thus provide the lower limit on downward movement of substrate support device 40. As best shown in FIG. 3A, lateral region 67B of lower chamber structure 67 has bores 117 through which linkage members (described hereinbelow) associated with backstop restraint members 143 extend. In addition, bellows 74 is annularly disposed around shaft 43 and connected between medial plate 73 and enlarged-diameter section 43A. As described hereinabove, bellows 74 provides a seal between main chamber 20 and the ambient environment, as well as between main chamber 20 and lower chamber 60 to prevent contamination of main chamber 20 resulting from the operation of the components within lower chamber 60.

Continuing with FIGS. 3A and 3B, chamber base 45 of substrate support device 40 moves axially with shaft 43 between the raised and lowered positions, and consequently between the substrate loading/removal and substrate processing states of substrate processing apparatus 10. Accordingly, in the preferred embodiment, chamber base 45 and/or a substrate hold-down device 120 such as a wafer chuck or platen (see FIGS. 4A–4D) mounted on chamber base 45 constitutes the lower sub-chamber surface 90C identified in FIG. 1B. Preferably, the uppermost region of chamber base 45 includes a scalloped or recessed section 45A in which a substrate can be placed. Recessed section 45A accommodates the mounting of substrate hold-down device 120 (FIGS. 4A–4D) onto chamber base 45. An internal surface of upper section 27 of main chamber 20 also includes a recessed section 27B that alternately serves as an upper boundary of the respective interiors of main chamber 20 and sub-chamber 90. When substrate processing apparatus 10 is in its substrate processing state, chamber base 45 engages upper section 27 in a sealed manner such that recessed sections 27B and 45A cooperatively define sub-chamber 90 in part. Preferably, all surfaces coming into direct contact with, and thus wetted by, the processing medium (such as the respective internal surfaces of upper section 27 and chamber base 45), are constructed from a corrosion-resistant material. Non-limiting examples of suitable corrosion-resistant materials include HASTELLOY® C-22 or C-276, superaustentic stainless steel such as alloy AL-6XN® or 25-6MO, MONEL® alloys and the like. Alternatively, the surfaces exposed to the processing medium are coated or plated with a corrosion-resistant barrier material such as PTFE, PCTFE, PVDF, nickel, or chromium.

Additional structural and operational features of substrate processing apparatus 10 will now be described with reference to FIGS. 4A–4D. Substrate hold-down device 120 is mounted within recessed section 45A of chamber base 45. Substrate hold-down device 120 includes a substrate support surface 120A on which a substrate can be held in place using any desired securing technique, as would be apparent to one of ordinary skill in the art after a review of our present disclosure. An internal fluid passage or passages 120B are formed in substrate hold-down device 120, and fluidly communicate with a processing medium outlet conduit 123. Processing medium outlet conduit 123 preferably extends through substrate support device 40, including a lower section 43B of shaft 43 that passes through axial bore 115 of lower chamber 60. This eliminates the need for forming an additional fluid bore through the structure of substrate processing apparatus 10. When substrate processing apparatus 10 is in the substrate processing state (see, e.g., FIGS. 4C and 4D), sub-chamber 90 becomes integrally coupled with a processing medium flow path. The part of the processing medium flow path upstream from sub-chamber 90 includes processing medium supply source 103, processing medium supply line 101, and a processing medium inlet conduit 127 formed through upper section 27 of main chamber 20. The part of the processing medium flow path downstream from sub-chamber 90 includes internal passages 120B of substrate hold-down device 120, outlet conduit 123, processing medium return line 105, and processing medium return circuit 107. Additionally, a radial passage 129 formed through lateral section 29 provides fluid communication between main chamber interior 25 and vacuum and/or vent source 79 through exhaust line 77. Another radial passage (not specifically shown) formed through lateral section 29 of main chamber 20 provides fluid communication between main chamber interior 25 and inert gas (e.g., $N_2$) supply source 83 through line 81 (see FIG. 1A). Preferably, these two radial passages are oriented approximately 60 degrees from each other with respect to the central longitudinal axis of main chamber interior 25.

As further illustrated in FIGS. 4A–4D, a linear actuator 49 is coupled to lower section 43B of shaft 43 of substrate support device 40. Linear actuator 49 preferably comprises a stepper motor and worm gear, but could also comprise a pneumatically or hydraulically driven piston, or other suitable device as would be apparent to one of ordinary skill in the art upon review of our present disclosure.

FIGS. 4A–4D also show additional details regarding the backstop mechanism, generally designated 140, provided by the invention. The primary components of the backstop mechanism 140 include backstop restraint member 143, a linear backstop actuator 145, and a linkage 147 interconnecting restraint member 143 and backstop actuator 145. Backstop mechanism 140 can comprise one or more units, with each unit including a corresponding backstop restraint member 143, a backstop actuator 145, and a linkage 147. Backstop actuator 145 preferably drives linkage 147 and restraint member 143 pneumatically, and thus comprises a suitable air cylinder and piston arrangement. Alternatively, backstop actuator 145 could be hydraulic or include a stepper-motor and a suitable force transferring means such as a lead screw. The structure of restraint member 143 preferably comprises a material suitable for withstanding the compressive forces imparted by the high-pressure environment established within sub-chamber 90. One example of a suitable material for restraint member 143 is SA-723 steel.

Continuing with FIGS. 4A–4D, backstop actuator 145 is disposed outside lower chamber 60, and linkage 147 extends through one or more bores 117 in the thickness of lateral region 67B of lower chamber 60 (as described hereinabove and illustrated in FIGS. 3A and 5). Linkage 147 is designed to suitably transfer the motive force produced by backstop actuator 145 to restraint member 143. Movement of linkage 147 and restraint member 143 occurs along a direction generally transverse to the direction of travel of substrate support device 40, and thus generally transverse to the longitudinal axis of main chamber interior 25. At the same time, linkage 147 is designed to elastically yield to permit restraint to be deflected in response to the load from sub-chamber 60 transferred through substrate support device 40. The direction of this yielding or deflection has a significant component along a direction parallel to the direction of travel of substrate support device 40. The compliancy of linkage 147 thus prevents failure modes that could be encountered by backstop mechanism 140 as a result of the cyclical, dynamic loads on substrate support device 40 during operation. At the same time, however, the compliant tolerance does not detrimentally affect the proper functioning of restraint member 143 to maintain the raised position of substrate support device 40 and consequently the isolated interface between sub-chamber 90 and main chamber 20.

In a preferred embodiment illustrated in FIG. 5, linkage 147 comprises a one or more solid rods 147A and 147B. More preferably, linkage 147 comprises a pair of rods 147A and 147B. Each rod 147A and 147B has a length ranging from approximately 10 to approximately 50 mm (preferably 35 mm), and a diameter ranging from approximately 1 to approximately 5 mm (preferably 3 mm). Preferably, each rod 147A and 147B is constructed from AISI 6150 Spring Steel.

Figure 4A:
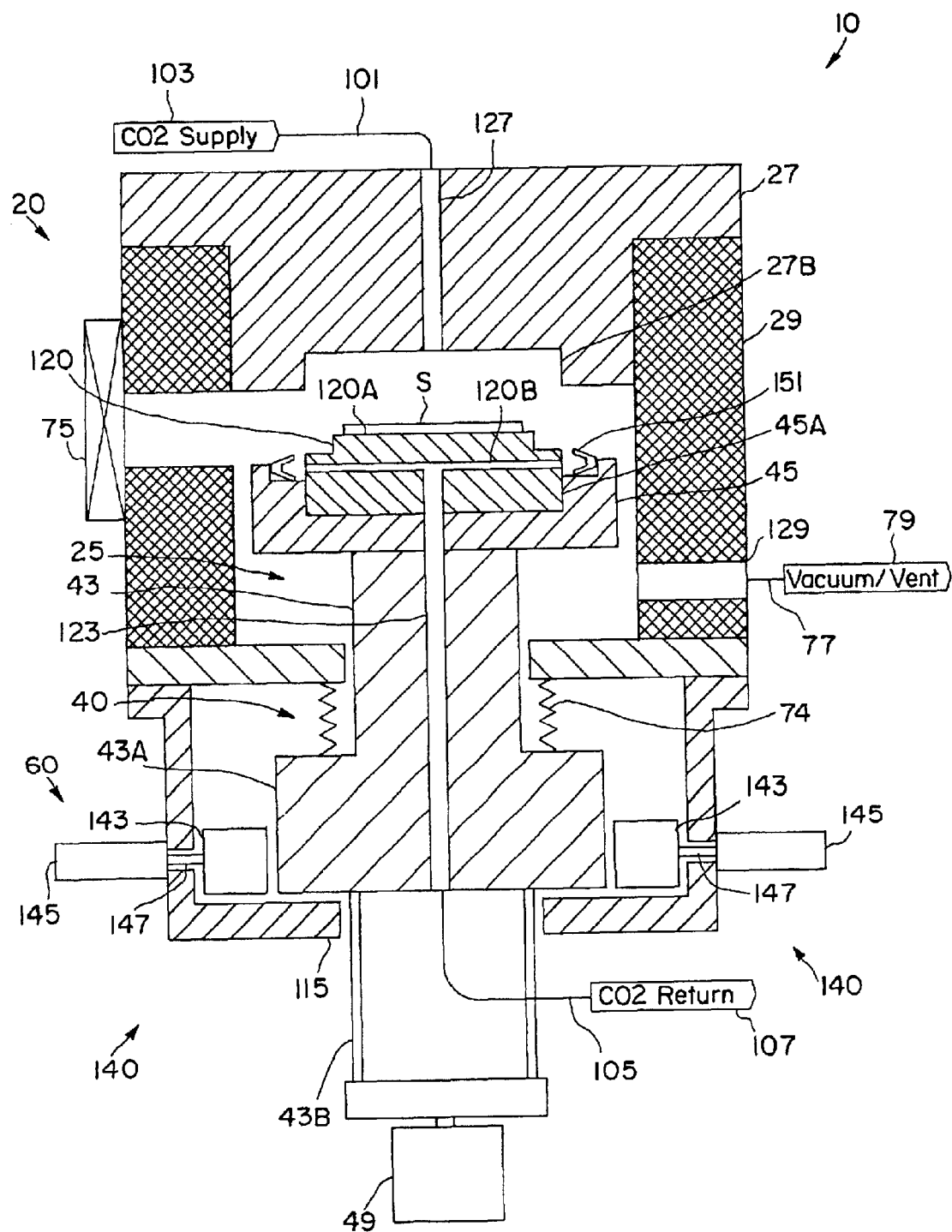
FIGS. 4A–4D are sequential, cutaway elevation views of the substrate processing apparatus according to the present invention, showing the adjustment of the apparatus between its substrate loading/removal position and its high-pressure substrate processing position.

Referring now specifically to FIG. 4A, substrate processing apparatus 10 is shown in the substrate loading/removal state, in which substrate support device 40 is retracted to its lowered position. At this position, substrate hold-down device 120 and any substrate mounted thereon are exposed to the environment contained within main chamber interior 25, and a separate sub-chamber is not completely defined. Substrate hold-down device 120 is disposed at an elevation at which it is operatively aligned with interface component 75. At this position, the end effector of a robot can travel laterally through opened interface element 75 into the confines of main chamber 20 to load a substrate onto substrate hold-down device 120 prior to a processing operation, or to remove such substrate after the processing operation. It will be noted that substrate support device 40 provides the only z-axis movement needed for the proper manipulation and orientation of the substrate within main chamber 20. That is, any robotic end effector employed to load and/or remove the substrate need only be capable of movement exclusively—or at least primarily—in the x-y plane.

The use of a structure that combines substrate support and substrate lifting capabilities provides several advantages. First, the robotic instrument utilized in conjunction with substrate processing apparatus 10 for substrate hand-off tasks can have a simpler, less costly design in comparison to robots fully operative in 3-space. Related to this first advantage, the configuration facilitates the integration of substrate processing apparatus 10 with another enclosed module such as a vacuum-operated central handler. The robots typically provided with such vacuum modules have limited vertical motion capabilities. Finally, the volume required for sub-chamber 90 is optimally minimized, because sub-chamber 90 does not need to be sized to accommodate appreciable z-axis movement of the robotic instrument.

Figure 4B:
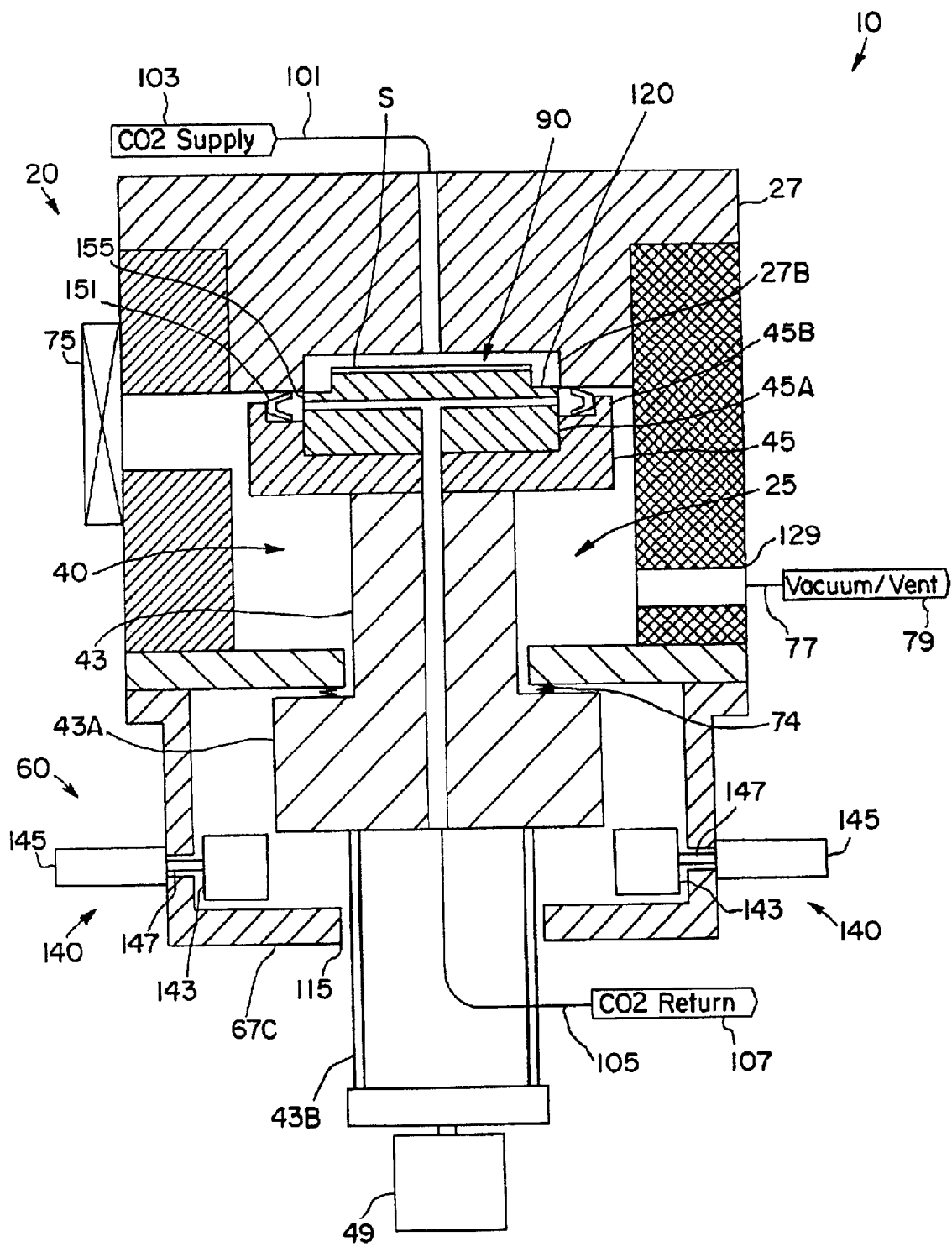

Referring now specifically to FIG. 4B, substrate processing apparatus 10 is shown in the high-pressure substrate processing state, in which substrate support device 40 is extended to its fully raised position to define sub-chamber 90. Moreover, at this raised position, sufficient axial clearance between enlarged-diameter section 43A of shaft 43 and outer end region 67C of lower chamber 60 is created to permit the radially-inward insertion of backstop restraint members 143 into the clearance. Isolation between sub-chamber 90 and main chamber 20 is enhanced or ensured by mounting a suitable sealing element 151 on chamber base 45.

In a preferred embodiment, an annular space 155 is defined radially between substrate hold-down device 120 and an annular shoulder 45B of chamber base 45, and ring-shaped sealing element 151 is disposed in this annular space 155. Once sub-chamber 90 is pressurized with processing medium, any leakage of the processing medium occurs through the interface between substrate hold-down device 120 and the internally facing side of upper section 27 of main chamber 20, and into annular space 155. The leakage then encounters sealing element 151 and is thereby prevented from escaping into main chamber interior 25.

Preferably, sealing element 151 is a cup seal rather than a simple O-ring or gasket. The inner side of cup seal 151 facing substrate hold-down device 120 is concave. This type of seal is self-energized in response to fluid pressure. Thus, if annular space 155 and the concave portion of cup seal 151 become pressurized by a leakage event, the concave portion expands and compresses against chamber base 45 and upper section 27 to enhance the quality of the seal. For this purpose, cup seal 151 is constructed from a suitable material that is resilient, chemically resistant to exposure to the chemistry of the processing medium, and able to maintain a pressure differential of as much as approximately 5000 psig or greater. Non-limiting examples of suitable materials for cup seal 151 include PTFE and PCTFE. Suitable cup seals 151 are MSE® seals available from Greene, Tweed & Co., Kulpsville, Pa., United States of America. As an alternative to the face seal orientated cup seal design, examples of other sealing elements 151 include piston seal orientated cup seals and o-ring seals.

Figure 4C:
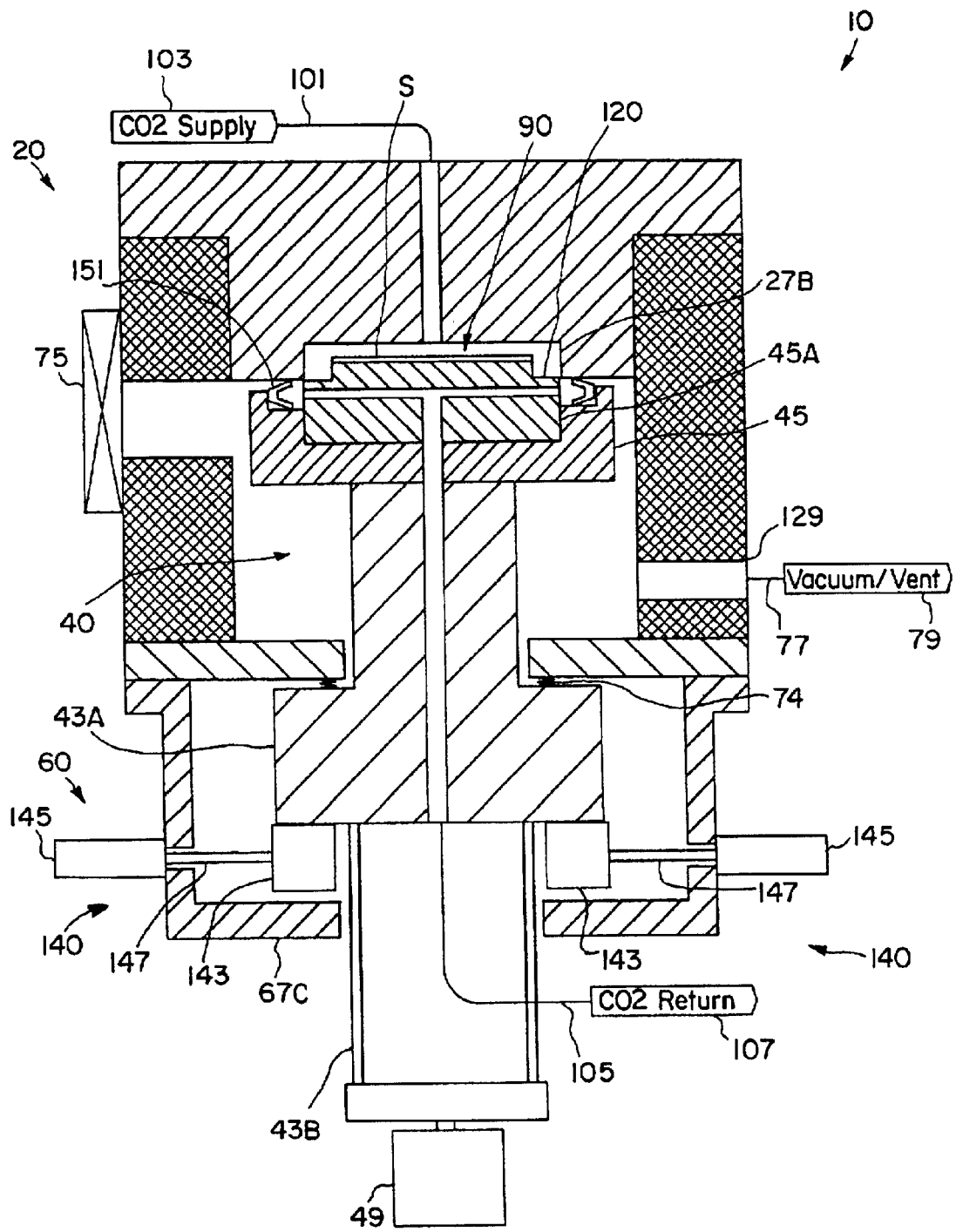

Referring now specifically to FIG. 4C, backstop restraint members 143 are shown in their fully extended, active positions within the clearance between enlarged-diameter section 43A of shaft 43 and outer end region 67C of lower chamber 60. At the active position, each restraint member 143 contacts the underside of enlarged-diameter section 43A to prevent undesirable retraction of substrate support device 40 during pressurization of sub-chamber 90, and thus to maintain the substrate in place during the cleaning process.

Figure 4D:
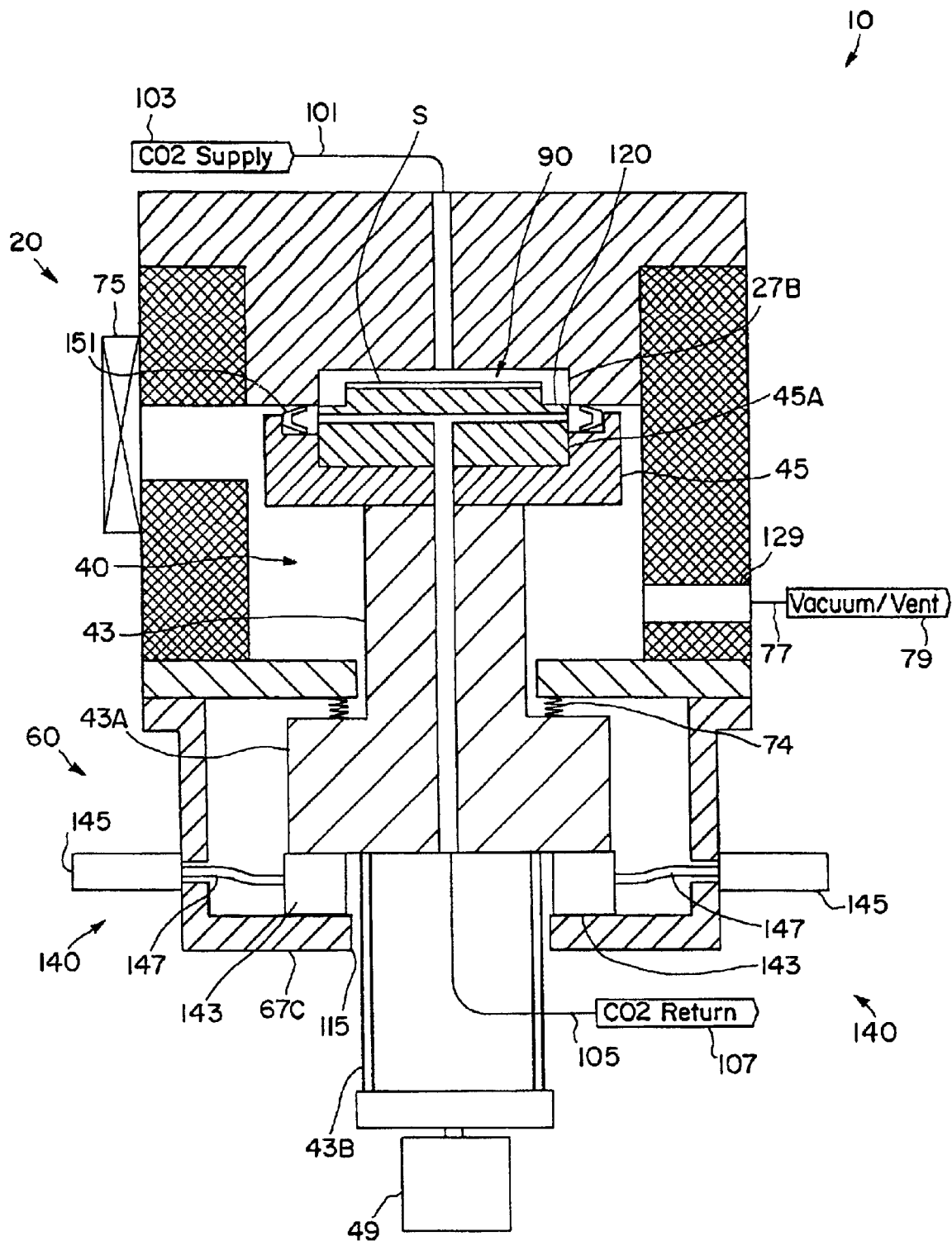

FIG. 4D illustrates the operation of the compliant feature that is built into the design of backstop mechanism 140, after sub-chamber 90 has been charged with processing medium. In response to the forces exerted by the high-pressure volume of sub-chamber 90, compliant linkages 147 have deflected to the point where backstop restraint members 143 are in compressive contact with both the underside of enlarged-diameter section 43A of shaft 43 and outer end region 67C of lower chamber 60. Linkages 147 have deflected to take up an acceptable amount (e.g., approximately 0.5 mm) of free play in substrate support device 120 without imposing undesired stresses on linkages 147 and/or their respective backstop actuators 145.

The operation of substrate processing apparatus 10 will now be described, with reference primarily being made to FIGS. 4A–4D. Substrate S is initially provided in an environment external to substrate processing apparatus 10. The external environment is typically a contained environment that includes a substrate-handling robot, and can be atmospheric or evacuated. An example of an external atmospheric environment is an EFEM (see, e.g., EFEM 210 in FIG. 6). An example of an external evacuated environment is a vacuum cluster tool (see, e.g., cluster tool 410 in FIG. 8). The external environment is coupled to substrate processing apparatus 10 through interface component 75. As understood by a person of ordinary skill in the art, interface component 75 has an internal gate that is movable between open and closed positions to selectively provide access through interface component 75 into main chamber interior 25. It will further be understood that, prior to loading substrate S into substrate processing apparatus 10, substrate S ordinarily will have undergone one or more fabrication processes (e.g., masking or other lithographic techniques involving the application of a photoresist, developers and UV radiation; etching; ashing; film deposition; electroplating; adhesion of bond pads; planarization; ion implantation; doping; micromachining; polishing; stress relieving; heating; and the like) that render a subsequent cleaning or surface preparation process necessary or desirable.

A number of other preliminary steps can be performed prior to loading substrate S into substrate processing apparatus 10. For example, main chamber interior 25 can be prepared prior to fluid coupling with the external environment. The manner by which main chamber interior 25 is prepared depends on whether substrate processing apparatus 10 is interfaced with a vacuum module or an atmospheric module. In the case where substrate processing apparatus 10 is coupled to a vacuum module, main chamber interior 25 can be evacuated and purged by establishing fluid communication with vacuum/vent source. In the case where substrate processing apparatus 10 is coupled to an atmospheric module, main chamber interior 25 can be purged by circulating an inert gas such as $N_2$ through main chamber interior 25 as described hereinabove.

In addition, the processing medium might need to be prepared prior to loading substrate S into substrate processing apparatus 10, or at least prior to injection of the processing medium into sub-chamber 90 in association with the high-pressure cleaning process described herein. In the case where a cleaning process is to be performed, the processing medium utilized in the invention can be any fluid suitable for cleaning substrate S by solvating the undesired residual material contained on substrate S, and/or by impacting the surface of substrate S to shear the undesired material through high-pressure injection of the cleaning fluid into sub-chamber 90. The cleaning fluid can have a unitary composition, or can be a multi-component mixture, solution, or emulsion. In a preferred embodiment, the cleaning fluid is dense liquid $CO_2$ that is heated and pressurized to a supercritical state prior to introduction into sub-chamber S. Additives such as co-solvents, reactants, passivants, drying agents, oxidizers, bases, surfactants or other chemicals can be introduced into the $CO_2$ stream flowing through supply line 101 or otherwise merged with the $CO_2$ stream prior to injection into sub-chamber S. The temperature and pressure required to attain the supercritical state of the $CO_2$ will depend on whether such additives are present. For pure liquid $CO_2$, the supercritical temperature is 31° C. and the supercritical pressure is 71 atm. In a preferred embodiment, the $CO_2$ is supplied at a pressure of approximately 1500 to approximately 5000 psig.

Once the processing medium and main chamber interior 25 are prepared, substrate support device 40 is moved to the lowered position shown in FIG. 4A and interface component 75 is opened. A robotic substrate-handling instrument transfers substrate S through interface component 75 and places substrate S onto substrate hold-down device 120. Substrate hold-down device 120 can be designed to employ any number of known securement techniques. One example is to create suction at uppermost surface 120A of substrate hold-down device 120. After substrate S is secured onto substrate hold-down device 120, interface component 75 is closed and substrate support device 40 is lifted to the raised position shown in FIG. 4B. At this position, sub-chamber S is formed and encloses substrate S. Backstop mechanisms 140 are then energized to insert restraint members 143 into the position shown in FIG. 4C to provide axial support for substrate support device 40 and maintain the integrity of the seal at the interface between sub-chamber 90 and main chamber interior 25. At this point, substrate S is ready to be cleaned. One or more valves appropriately positioned along processing medium inlet line 101 are opened, and processing medium is pumped into sub-chamber 90. Sub-chamber 90 can be pressurized with processing medium to pressures ranging from 20 psig to 5000 psig. If desired, prior to pressurization, the processing medium can be flowed into sub-chamber 90 at low pressure and routed to return circuit 107 to purge air from sub-chamber 90 and the associated fluid paths upstream and downstream from sub-chamber 90. During the high-pressure cleaning process, if desired, sub-chamber 90 can be rapidly pressurized and depressurized in a cyclical manner to create pressure pulses to enhance the cleaning effect. The depressurization phase of this cycle can be useful in removing undesired material (such as photoresist or etch residue deposits that have softened during the pressurization phase) from microscale features such as trenches or vias formed on substrate S.

Once the cleaning process is complete, appropriately positioned valves in the processing medium return path are opened so that the processing medium can be flushed from sub-chamber 90 to return circuit 107. The flushing step can include circulating additional, pure processing medium through sub-chamber 90. Thereafter, substrate processing apparatus 10 is adjusted back to the loading/removal state shown in FIG. 4A by moving substrate support device 40 to its lowered position as described hereinabove. Interface component 75 is then opened to admit the substrate-handling instrument into main chamber interior 25 to remove substrate S from substrate processing apparatus 10, for further processing in a different module as necessary. Components (described hereinbelow) can be provided for recovering at least a portion of the processing medium used to clean substrate S, separating the contaminant material from the processing medium, and recirculating the purified processing medium back into the system for reuse.

Figure 6:
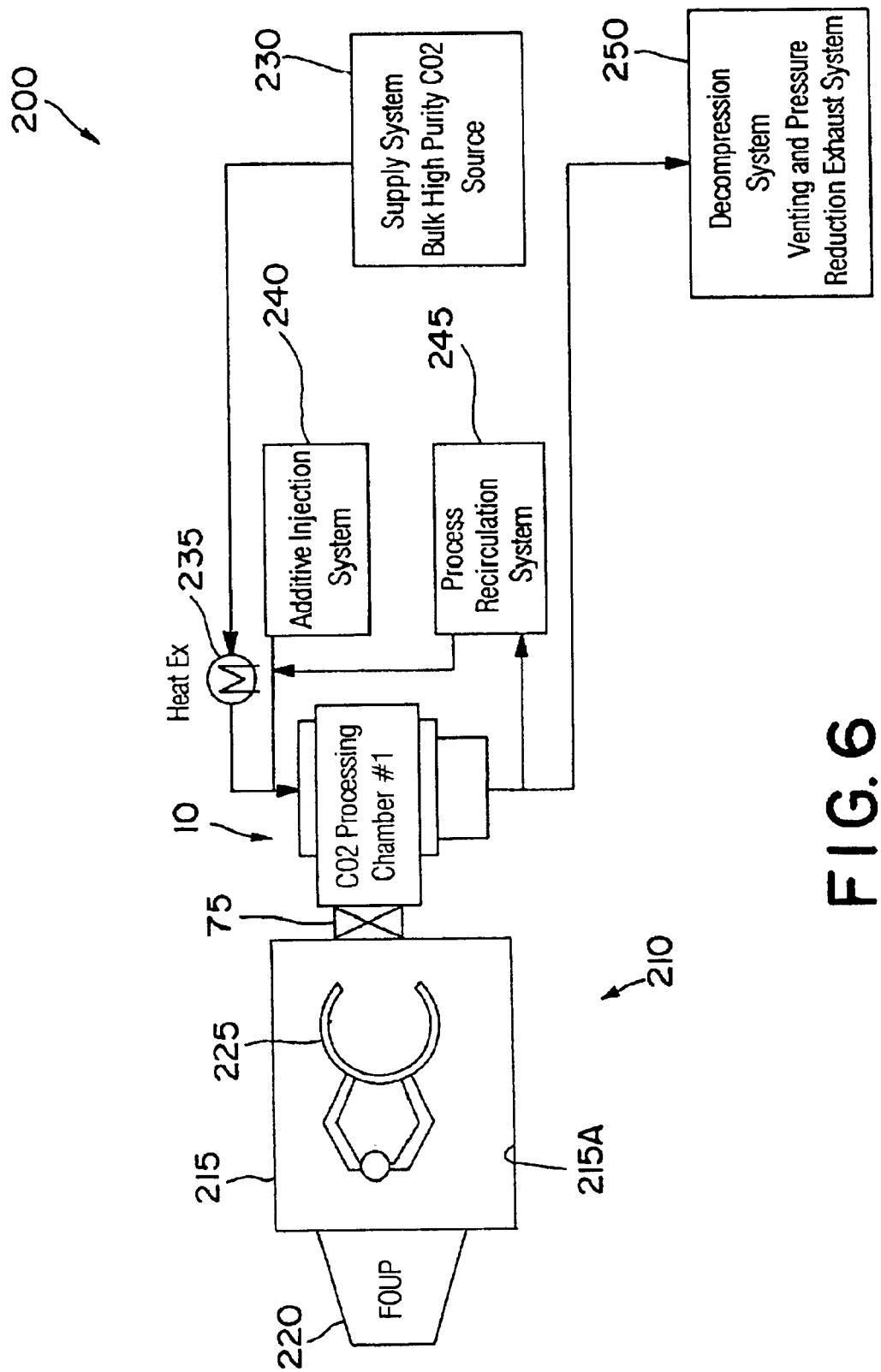
FIG. 6 is a schematic diagram illustrating the integration of the substrate processing apparatus with a stand-alone atmospheric substrate processing system in accordance with the present invention.
Figure 7:
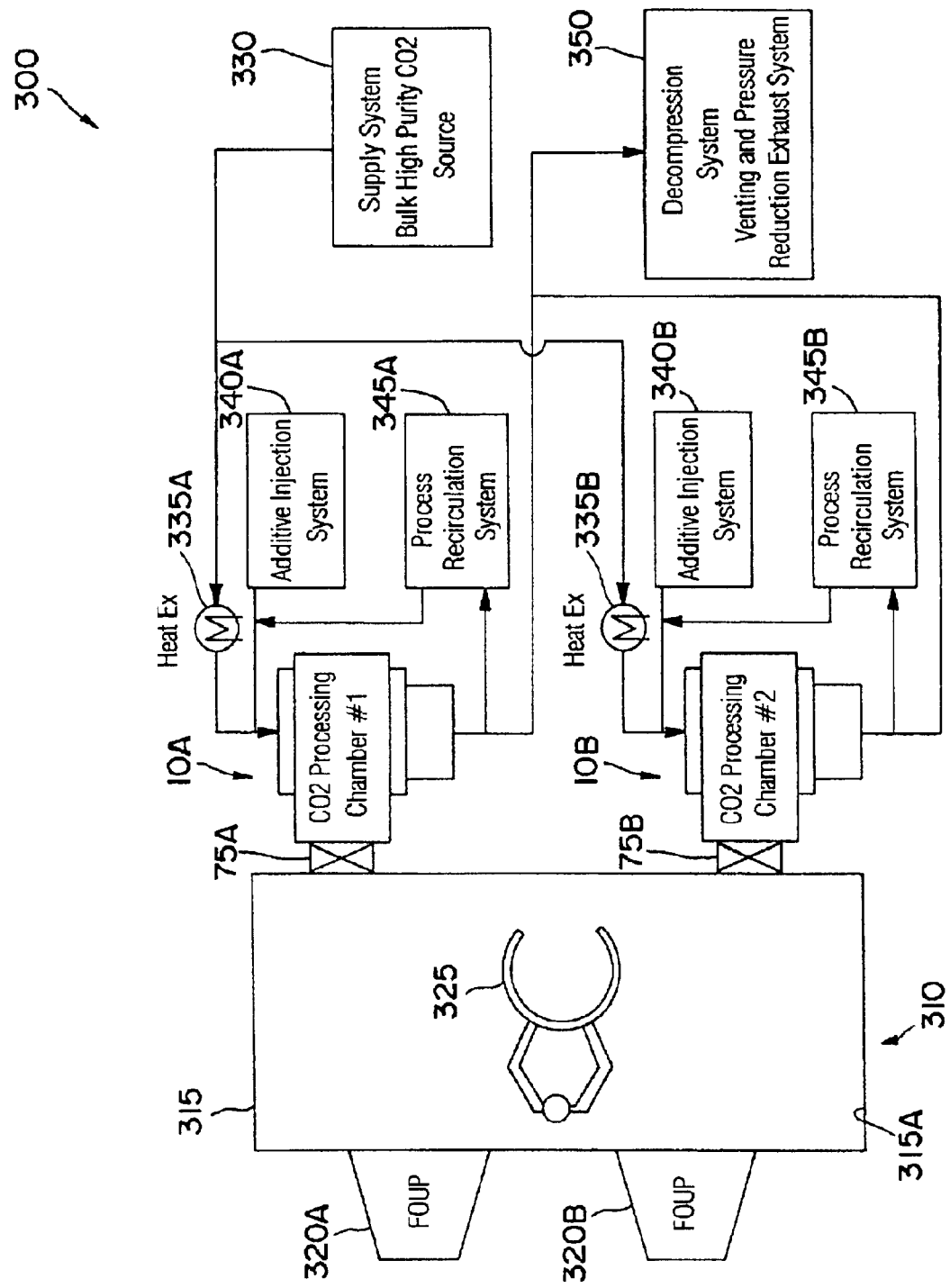
FIG. 7 is a schematic diagram illustrating the integration of the substrate processing apparatus with a clustered atmospheric substrate processing system.
Figure 8:
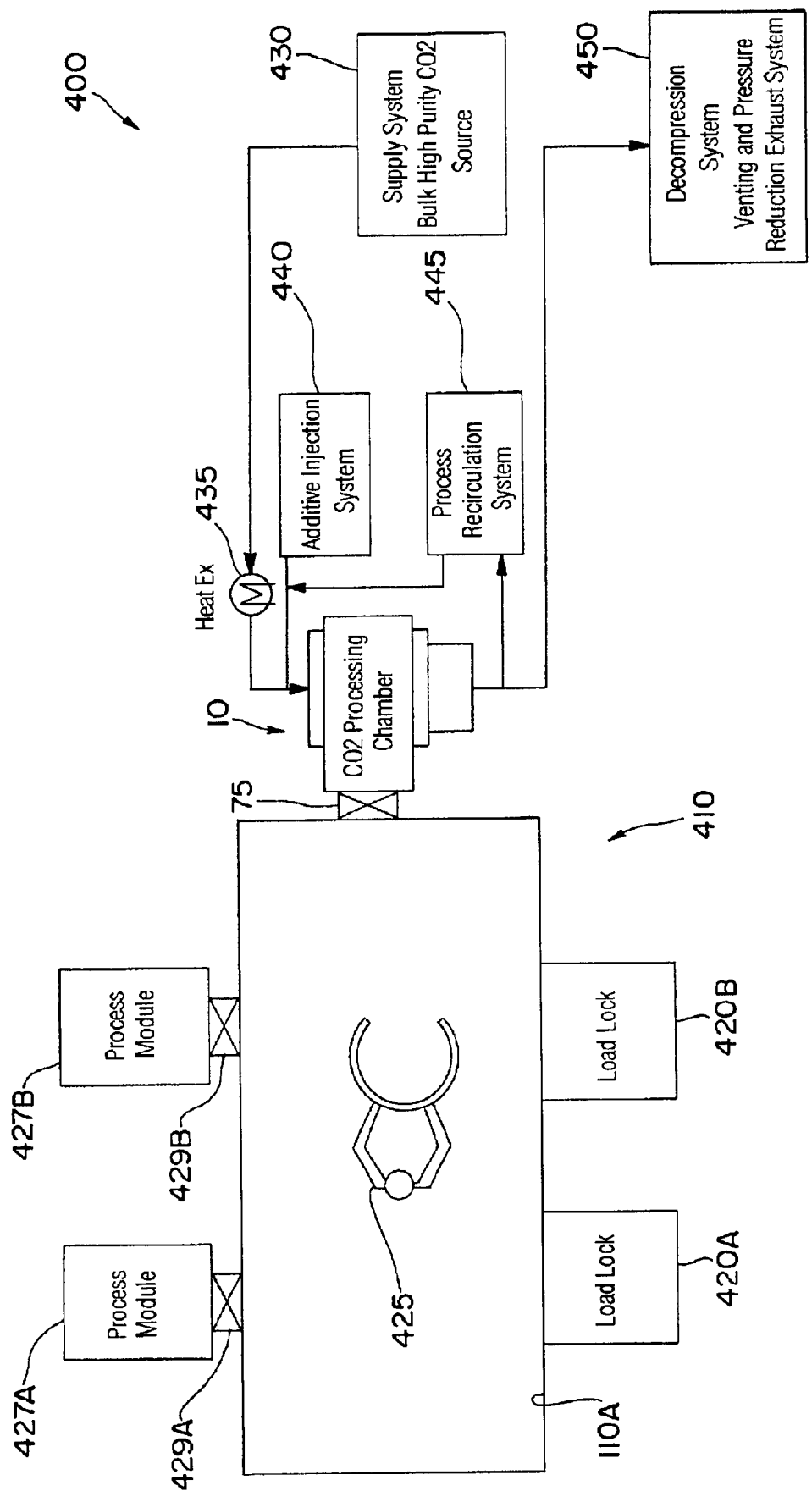
FIG. 8 is a schematic diagram illustrating the integration of the substrate processing apparatus with a clustered vacuum substrate processing system.

Referring now to FIGS. 6–8, examples are illustrated of system-level embodiments in which substrate processing apparatus 10 is integrated with a processing medium distribution circuit and other substrate processing modules. FIG. 6 illustrates a stand-alone atmospheric system, generally designated 200. In this system 200, substrate processing apparatus 10 is directly coupled through interface component 75 to an "equipment front end module" or EFEM, generally designated 210, comprising an atmospheric substrate transfer module 215 and substrate loading and/or sorting device 220. Substrate transfer module 215 can be of conventional design, and comprises an enclosure 215A and a substrate transfer robot 225. Substrate transfer module 215 is typically coupled to substrate loading device 220 according to standard mechanical interface (SMIF) technology. Substrate loading device 220 can be a conventionally designed wafer cassette or pod device (e.g., a SMIF pod, or a front opening unified pod or "FOUR"). By this configuration, robot 225 can transfer substrates from substrate loading device 220, through interface component 75, and into substrate processing apparatus 10.

In FIG. 6, the processing medium distribution circuit coupled to substrate processing apparatus 10 comprises a supply/pressurization subsystem 230 (which can be associated with processing medium supply source 103 in FIGS. 1B and 4A–4D) for supplying pressurized processing medium to substrate processing apparatus 10 from bulk storage. Processing medium supplied from this subsystem 230 is routed through a suitable heat exchanger 235 to heat the processing medium to or beyond its supercritical temperature, in a preferred embodiment. An additive injection subsystem 240 is provided to mix additives with the processing medium as described hereinabove. A recirculation subsystem 245 is provided for recovering and purifying used processing medium, as also described hereinabove. Finally, a decompression subsystem 250 (which can be associated with vacuum/vent source 79 in FIGS. 1B and 4A–4D) serves as an exhaust system for the purposes of purging, venting and/or evacuating substrate processing apparatus 10.

FIG. 7 illustrates a clustered atmospheric system, generally designated 300. In this system 300, EFEM 310 comprises a clusterable atmospheric substrate transfer module 315 and a plurality of substrate loading devices 320A and 320B (two of which are illustrated). Substrate transfer module 315 again generally comprises an enclosure 315A and a substrate transfer robot 325. System 300 also provides a plurality of substrate processing devices 10A and 10B (two are shown in the example) are coupled to substrate transfer module 315 through respective interface components 75A and 75B. By way of example, supply/pressurization subsystem 330 and decompression subsystem 350 are common to all substrate processing apparatuses 10A and 10B, while dedicated elements such as additive injection subsystems 340A and 340B, heat exchangers 335A and 335B, and recirculation subsystems 345A and 345B are provided for each respective substrate processing apparatus 10A and 10B.

FIG. 8 illustrates a clustered vacuum system, generally designated 400. In this system 400, substrate processing apparatus 10 is directly coupled to a vacuum cluster tool, generally designated 410. Vacuum cluster tool 410 can be of conventional design, and comprises an enclosure 410A and a substrate transfer robot 425. The evacuated volume maintained by enclosure 410A requires that one or more loadlock devices 420A and 420B be employed to serve as the interface between vacuum cluster tool 410 and compatible substrate loading modules (not shown). One or more microscale device fabrication modules 427A and 427B are coupled to vacuum cluster tool 410 by means of respective hermetic valves 429A and 429B, and are accessible by substrate transfer robot 425. Device fabrication modules 427A and 427B can be adapted for conducting fabrication procedures on substrates either prior or subsequent to the above-described substrate cleaning process executed by substrate processing apparatus 10. Non-limiting examples of possible fabrication procedures include physical vapor deposition, chemical vapor deposition, evaporation, sublimation, oxidizing, carbonizing, nitriding, doping, annealing, wet or dry etching, ashing, microscale assembly, self-assembly of monolayers, lithography, wafer-to-wafer bonding or encapsulation, micromachining, planarization, and the like. The processing medium distribution circuit (elements 430–450) can be arranged in a manner analogous to the illustrations provided in FIGS. 6 and 7.

From the foregoing description of the respective systems 200, 300 and 400 illustrated in FIGS. 6–8, it can be seen that the invention is sufficiently flexible to enable direct integration between substrate processing apparatus 10 and other substrate processing modules operating under either a high-purity atmospheric regime or a vacuum regime, and in conjunction with any number and types of desired processing steps. The transfer of a substrate between these various processing modules does not require exposing the substrate to the ambient environment, thereby optimizing any combination of fabrication and processing medium contemplated by the user of such systems.

It will be understood that various details of the invention may be changed without departing from the scope of the invention. Furthermore, the foregoing description is for the purpose of illustration only, and not for the purpose of limitation—the invention being defined by the claims.

What is claimed is:

1. An apparatus for processing a microelectronic substrate, comprising:

(a) a main chamber comprising a main chamber wall, the main chamber wall enclosing a main chamber interior;

(b) a sub-chamber disposed within the main chamber interior for containing a microelectronic substrate, the sub-chamber comprising a sub-chamber wall enclosing a sub-chamber interior, wherein the sub-chamber wall comprises a boundary and the sub-chamber interior is adapted for fluid isolation from the main chamber when the sub-chamber is in a closed position;

(c) a fluid conduit formed through the main chamber wall and communicating with the sub-chamber interior; and (d) a movable backstop device adapted for providing support to at least one portion of the sub-chamber wall when the sub-chamber is closed.

2. The apparatus according to claim 1 wherein the sub-chamber is adapted to maintain a higher pressure in the sub-chamber interior than the main chamber.

3. The apparatus according to claim 2 wherein the sub-chamber is adapted to maintain an above-atmospheric pressure in the sub-chamber interior while the main chamber interior is at a substantially atmospheric pressure.

4. The apparatus according to claim 2 wherein the sub-chamber is adapted to maintain an above-atmospheric pressure in the sub-chamber interior while the main chamber interior is at a below-atmospheric pressure.

5. The apparatus according to claim 1 comprising a processing medium supply source communicating with the sub-chamber interior through the fluid conduit for pressurizing the sub-chamber interior to a pressure greater than the main chamber interior.

6. The apparatus according to claim 1 comprising a vacuum source fluidly communicating with the main chamber interior.

7. The apparatus according to claim 1 comprising a vent fluidly communicating with the main chamber interior.

8. The apparatus according to claim 1 comprising a gas supply source fluidly communicating with the main chamber interior.

9. The apparatus according to claim 1 wherein the fluid conduit formed through the main chamber wall is a fluid inlet conduit, the apparatus further comprising a fluid outlet conduit fluidly communicating with the sub-chamber interior.

10. The apparatus according to claim 1 comprising a sealing element disposed at an interface between the sub-chamber interior and the main chamber interior and adapted to enhance fluid isolation between the sub-chamber interior and the main chamber interior.

11. The apparatus according to claim 10 wherein the sealing element is supported by a substrate support surface disposed within the sub-chamber.

12. The apparatus according to claim 1 comprising a hermetically-sealed gate providing an interface between the main chamber interior and an environment external to the main chamber, wherein the gate is adapted to selectively provide access into the main chamber interior.

13. The apparatus according to claim 1 wherein the sub-chamber interior has a volume ranging from approximately 10 ml to approximately 10 l.

14. The apparatus according to claim 1 wherein the sub-chamber interior has a diameter ranging from approximately 50 mm to approximately 450 mm.

15. The apparatus according to claim 1 wherein the boundary of the sub-chamber wall is movable within the main chamber interior between a closed position and an open position, wherein at the closed position the boundary at least partially encloses the sub-chamber interior and at least partially fluidly isolates the sub-chamber interior from the main chamber.

16. The apparatus according to claim 15 wherein, at the closed position of the boundary, the boundary cooperates with an interior surface of the apparatus to enclose the sub-chamber interior and fluidly isolate the sub-chamber interior from the main chamber interior.

17. The apparatus according to claim 15 wherein the boundary of the sub-chamber wall comprises one of: (i) a substrate support surface movable in relation to a sub-chamber interior surface; or (ii) a sub-chamber interior surface movable in relation to a substrate support surface disposed within the sub-chamber interior; or (iii) a substrate support surface and a sub-chamber interior surface, wherein the substrate support surface and the sub-chamber interior surface are movable in relation to each other.

18. An apparatus for processing a microelectronic substrate, comprising:

(a) a main chamber comprising a main chamber wall, the main chamber wall enclosing a main chamber interior;

(b) a movable boundary disposed within the main chamber interior and movable between a first position and a second position, wherein at the first position the movable boundary at least partially defines a sub-chamber comprising a sub-chamber interior fluidly isolated from the main chamber interior; and (c) a movable backstop device adapted for providing support to the boundary when the boundary is in the first position.

19. The apparatus according to claim 18 further comprising a fluid conduit extending through the main chamber wall in communication with the sub-chamber interior.

20. The apparatus according to claim 19 wherein the fluid conduit formed through the main chamber wall is a fluid inlet conduit, the apparatus further comprising a fluid outlet conduit fluidly communicating with the sub-chamber interior.

21. The apparatus according to claim 18 comprising a processing medium supply source communicating with the sub-chamber interior for pressurizing the sub-chamber interior to a pressure greater than the main chamber interior.

22. The apparatus according to claim 18 wherein, at the first position of the movable boundary, the sub-chamber interior has a higher pressure than the main chamber interior.

23. The apparatus according to claim 22 wherein, at the first position of the movable boundary, the sub-chamber interior has an above-atmospheric pressure and the main chamber interior has a substantially atmospheric pressure.

24. The apparatus according to claim 22 wherein, at the first position of the movable boundary, the sub-chamber interior has an above-atmospheric pressure and the main chamber interior has a below-atmospheric pressure.

25. The apparatus according to claim 18 wherein, at the first position of the movable boundary, the boundary cooperates with an interior surface of the apparatus to enclose the sub-chamber interior and fluidly isolate the sub-chamber interior from the main chamber interior.

26. The apparatus according to claim 18 wherein the movable boundary comprises one of: (i) a substrate support surface movable in relation to a sub-chamber interior surface; or (ii) a sub-chamber interior surface movable in relation to a substrate support surface disposed within the sub-chamber interior; or (iii) a substrate support surface and a sub-chamber interior surface, wherein the substrate support surface and the sub-chamber interior surface are movable in relation to each other.

27. The apparatus according to claim 18 comprising a vacuum source fluidly communicating with the main chamber interior.

28. The apparatus according to claim 18 comprising a vent fluidly communicating with the main chamber interior.

29. The apparatus according to claim 18 comprising a gas supply source fluidly communicating with the main chamber interior.

30. The apparatus according to claim 18 comprising a sealing element disposed within the main chamber wherein, at the first position of the movable boundary, the sealing element fluidly isolates the sub-chamber interior from the main chamber interior.

31. The apparatus according to claim 30 wherein the sealing element is supported by a substrate support surface disposed within the sub-chamber.

32. The apparatus according to claim 18 comprising a hermetically-sealed gate providing an interface between the main chamber interior and an environment external to the main chamber, wherein the gate is adapted to selectively provide access into the main chamber interior.

33. The apparatus according to claim 18 wherein the sub-chamber interior has a volume ranging from approximately 10 ml to approximately 10 l.

34. The apparatus according to claim 18 wherein the sub-chamber interior has a diameter ranging from approximately 50 mm to approximately 450 mm.

35. An apparatus for processing a microelectronic substrate, comprising:
   (a) a main chamber comprising a main chamber wall, the main chamber wall enclosing a main chamber interior and comprising an interior surface;
   (b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;
   (c) a fluid conduit extending through the main chamber wall in communication with the sub-chamber; and
   (d) a moveable backstop device adapted for providing support to the substrate support device when the substrate support device is at the closed position.

36. The apparatus according to claim 35 wherein at least a portion of the substrate support device is constructed from a high-yield strength material.

37. The apparatus according to claim 35 wherein at least a portion of the main chamber wall is constructed from a high-yield strength material.

38. The apparatus according to claim 35 wherein the interior surface of the main chamber wall and the substrate support surface are constructed from a corrosion-resistant material.

39. The apparatus according to claim 35 wherein the interior surface of the main chamber wall and the substrate support surface are treated with a corrosion-resistant material.

40. The apparatus according to claim 35 comprising a hermetically-sealed gate providing an interface between the main chamber interior and an environment external to the main chamber wherein, at the open position of the substrate support device, the substrate support surface is generally aligned with the gate to permit access to the substrate support surface from the external environment.

41. The apparatus according to claim 35 comprising a sealing element disposed within the main chamber wherein, at the closed position of the substrate support device, the sealing element provides a fluidly sealed boundary between the sub-chamber and the main chamber interior.

42. The apparatus according to claim 41 wherein the sealing element is supported by the substrate support device and circumscribes the substrate support surface.

43. The apparatus according to claim 35 wherein, at the closed position of the substrate support device, the sub-chamber has an above-atmospheric pressure and the main chamber interior has a substantially atmospheric pressure.

44. The apparatus according to claim 35 wherein, at the closed position of the substrate support device, the sub-chamber has an above-atmospheric pressure and the main chamber interior has a below-atmospheric pressure.

45. The apparatus according to claim 35 wherein the main chamber has an end portion, the end portion has a bore opening into the main chamber, the substrate support device is movable through the bore, and the apparatus further comprises a sealing element disposed at the bore and fluidly isolating the main chamber interior from an environment external to main chamber.

46. The apparatus according to claim 35 comprising an actuator coupled to the substrate support device for moving the substrate support device between the open and closed positions.

47. An apparatus for processing substrates, comprising:
   (a) a movable substrate support structure comprising a substrate support surface and a sealing element;
   (b) a processing chamber bounded by the substrate support surface and the sealing element;
   (c) a main chamber surrounding the processing chamber and enclosing a main chamber interior fluidly sealable from an environment external to the main chamber and from the processing chamber;
   (d) an actuator coupled to the substrate support surface and adapted for controlling the processing chamber between an open state and a closed state wherein, at the closed state, the sealing element provides a fluidly isolated boundary between the processing chamber and the main chamber and, at the open state, the substrate support surface is exposed to the main chamber interior; and
   (e) a moveable backstop device adapted for providing support to the substrate support structure when the processing chamber is in the closed state.

48. An apparatus for processing a microelectronic substrate and adjustable between a substrate processing mode and a substrate access mode, the apparatus comprising:
   (a) a main chamber comprising a main chamber wall, the main chamber wall enclosing a main chamber interior;
   (b) an interface component mounted to the main chamber and operable between an open state and a closed state, wherein (i) at the open state, the interface component permits access into the main chamber interior from an environment external to the main chamber, and (ii) at the closed state, the interface component seals the main chamber from the external environment;
   (c) a boundary movable within the main chamber to a first position corresponding to the substrate processing mode and alternately to a second position corresponding to the substrate access mode, wherein (i) at the first position, the boundary at least partially defines a pressurizable sub-chamber sealingly segregated from the main chamber interior and adapted to confine a substrate, and (ii) at the second position, the boundary permits the substrate to be transferred into and out from the main chamber through the open-state interface component; and
   (d) a movable backstop device adapted for providing support to the boundary when the boundary is in the first position.

49. The apparatus according to claim 48 comprising a substrate handling module enclosing the external environment, wherein the interface component intercouples the main chamber and the substrate handling module.

50. The apparatus according to claim 49 wherein the substrate handling module comprises a substrate transfer chamber and a robotic end effector disposed within the substrate transfer chamber, and the interface component is adapted for accommodating movement of the end effector therethrough from the substrate transfer chamber to and from the main chamber interior.

51. The apparatus according to claim 49 wherein the main chamber and the substrate handling module enclose respective substantially atmospheric pressure environments.

52. The apparatus according to claim 51 comprising a substrate loading device coupled to the substrate handling module.

53. The apparatus according to claim 49 wherein the main chamber and the substrate handling module enclose respective vacuum environments.

54. The apparatus according to claim 53 comprising a vacuum substrate fabrication module hermetically coupled to the substrate handling module.

55. The apparatus according to claim 1 further comprising a support device and wherein the backstop device is adapted to provide support to the sub-chamber wall through the support device.

56. An apparatus for processing a microelectronic substrate, comprising:
  (a) a main chamber comprising a main chamber wall, the main chamber wall enclosing a main chamber interior and comprising an interior surface;
  (b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;
  (c) a fluid conduit extending through the main chamber wall in communication with the sub-chamber; and
  (d) a backstop device mechanically referenced to the main chamber wall.

57. An apparatus for processing a microelectronic substrate, comprising:
  (a) a main chamber comprising a main chamber wall, the main chamber wall enclosing a main chamber interior and comprising an interior surface;
  (b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;
  (c) a fluid conduit extending through the main chamber wall in communication with the sub-chamber; and
  (d) a backstop device mechanically referenced to the main chamber wall, wherein the backstop device comprises a restraint member movable between the substrate support device and the structure referenced to the main chamber wall.

58. An apparatus for processing a microelectronic substrate, comprising:
  (a) a main chamber comprising a main chamber wall, the main chamber wall enclosing a main chamber interior and comprising an interior surface;
  (b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;
  (c) a fluid conduit extending through the main chamber wall in communication with the sub-chamber; and
  (d) a backstop device mechanically referenced to the main chamber wall, wherein the backstop device comprises a restraint member movable between the substrate support device and the structure referenced to the main chamber wall, and wherein the backstop device comprises an actuator and a complaint linkage intercoupling the actuator and the restraint member.

59. An apparatus for processing a microelectronic substrate, comprising:
  (a) a main chamber comprising a main chamber wall, the main chamber wall enclosing a main chamber interior and comprising an interior surface;
  (b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;
  (c) a fluid conduit extending through the main chamber wall in communication with the sub-chamber; and
  (d) a backstop device mechanically referenced to the main chamber wall, wherein the backstop device comprises a restraint member movable between the substrate support device and the structure referenced to the main chamber wall, wherein the backstop device comprises an actuator and a complaint linkage intercoupling the actuator and the restraint member, and wherein the complaint linkage comprises a rod.

60. An apparatus for processing a microelectronic substrate, comprising:
  (a) a main chamber comprising a main chamber wall, the main chamber wall enclosing a main chamber interior and comprising an interior surface;
  (b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;
  (c) a fluid conduit extending through the main chamber wall in communication with the sub-chamber; and
  (d) a backstop device mechanically referenced to the main chamber wall, wherein the backstop device comprises a restraint member movable between the substrate support device and the structure referenced to the main chamber wall, wherein the backstop device comprises an actuator and a complaint linkage intercoupling the actuator and the restraint member, and wherein the complaint linkage comprises a rod having a length ranging from approximately 10 mm to approximately 100 mm.

61. An apparatus for processing a microelectronic substrate, comprising:
  (a) a main chamber comprising a main chamber wall, the main chamber wall enclosing a main chamber interior and comprising an interior surface;

(b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;

(c) a fluid conduit extending through the main chamber wall in communication with the sub-chamber; and (d) a backstop device mechanically referenced to the main chamber wall, wherein the backstop device comprises a restraint member movable between the substrate support device and the structure referenced to the main chamber wall, wherein the backstop device comprises an actuator and a complaint linkage intercoupling the actuator and the restraint member, and wherein the complaint linkage comprises a rod having a length ranging from approximately 10 mm to approximately 100 mm and having a diameter ranging from approximately 1 mm to approximately 5 mm.

62. An apparatus for processing a microelectronic substrate, comprising:

(a) a main chamber comprising a main chamber wall, the main chamber wall enclosing a main chamber interior and comprising an interior surface;

(b) a substrate support device movable within the main chamber interior between an open position and a closed position, the substrate support device comprising a substrate support surface wherein, at the closed position, the substrate support surface and the interior surface at least partially define a sub-chamber fluidly isolated from the main chamber interior;

(c) a fluid conduit extending through the main chamber wall in communication with the sub-chamber; and (d) a backstop device mechanically referenced to the main chamber wall, wherein the backstop device comprises a restraint member movable between the substrate support device and the structure referenced to the main chamber wall, wherein the backstop device comprises an actuator and a complaint linkage intercoupling the actuator and the restraint member, and wherein the complaint linkage comprises at least two rods.

* * * * *